(12) United States Patent
Knag et al.

(10) Patent No.: US 10,642,922 B2
(45) Date of Patent: May 5, 2020

(54) BINARY, TERNARY AND BIT SERIAL COMPUTE-IN-MEMORY CIRCUITS

(71) Applicant: Intel Corporation, Santa Clara, CA (US)

(72) Inventors: Phil Knag, Hillsboro, OR (US); Gregory K. Chen, Portland, OR (US); Raghavan Kumar, Hillsboro, OR (US); Huseyin Ekin Sumbul, Portland, OR (US); Abhishek Sharma, Hillsboro, OR (US); Sasikanth Manipatruni, Portland, OR (US); Amrita Mathuriya, Portland, OR (US); Ram Krishnamurthy, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/147,036

(22) Filed: Sep. 28, 2018

(65) Prior Publication Data
US 2019/0102359 A1 Apr. 4, 2019

(51) Int. Cl.
*G06F 17/16* (2006.01)
*G11C 11/419* (2006.01)
(Continued)

(52) U.S. Cl.
CPC .......... *G06F 17/16* (2013.01); *G06F 9/3001* (2013.01); *G06N 3/063* (2013.01); *G11C 7/1006* (2013.01); *G11C 7/1075* (2013.01); *G11C 7/12* (2013.01); *G11C 8/08* (2013.01); *G11C 11/418* (2013.01); *G11C 11/419* (2013.01); *G11C 11/56* (2013.01)

(58) Field of Classification Search
CPC ... G11C 11/409; G11C 11/418; G11C 11/419; G11C 11/54; G11C 13/0002; G11C 13/0026; G11C 13/0028; G11C 13/004; G11C 13/0069; G11C 7/1006; G11C 7/12; G11C 8/08; G06F 17/16
See application file for complete search history.

(56) References Cited

U.S. PATENT DOCUMENTS 10,496,374 B2 * 12/2019 Hu ................. G06F 7/5443
2016/0049195 A1 * 2/2016 Yu ................. G11C 13/0026
365/63

(Continued)

OTHER PUBLICATIONS

Ambrogio, S., et al., "Equivalent-Accuracy Accelerated Neural-Network Training Using Analogue Memory," Nature, vol. 558, Jun. 7, 2018, 22 pages.

(Continued)

*Primary Examiner* — Matthew D Sandifer
(74) *Attorney, Agent, or Firm* — Compass IP Law PC

(57) ABSTRACT

A binary CIM circuit enables all memory cells in a memory array to be effectively accessible simultaneously for computation using fixed pulse widths on the wordlines and equal capacitance on the bitlines. The fixed pulse widths and equal capacitance ensure that a minimum voltage drop in the bitline represents one least significant bit (LSB) so that the bitline voltage swing remains safely within the maximum allowable range. The binary CIM circuit maximizes the effective memory bandwidth of a memory array for a given maximum voltage range of bitline voltage.

26 Claims, 13 Drawing Sheets

(51) Int. Cl.
  *G11C 11/418* (2006.01)
  *G11C 7/12* (2006.01)
  *G11C 8/08* (2006.01)
  *G11C 11/56* (2006.01)
  *G06F 9/30* (2018.01)
  *G11C 7/10* (2006.01)
  *G06N 3/063* (2006.01)

(56) References Cited

U.S. PATENT DOCUMENTS

| | | | | |
|---|---|---|---|---|
| 2018/0095930 A1* | 4/2018 | Lu | ............... | G11C 7/1006 |
| 2019/0213234 A1* | 7/2019 | Bayat | ............ | G11C 16/0483 |
| 2019/0362787 A1* | 11/2019 | Lu | ............... | G11C 11/56 |

OTHER PUBLICATIONS

Biswas, A., et al., "A 42pJ/decision 3.12TOPS/W Robust In-Memory Machine Learning Classifier With On-Chip Training," 2018 IEEE International Solid-State Circuits Conference—(ISSCC), San Francisco, CA, 2018, pp. 488-490.

Fick, D., et al., "Analog Computation in Flash Memory for Datacenter-Scale AI Inference in a Small Chip", 2.05 Mythic Hot Chips, 2018, 28 pages.

Gonugondla, S.K., et al., "A 42pJ/decision 3.12TOPS/W Robust In-Memory Machine Learning Classifier With On-Chip Training," 2018 IEEE International Solid-State Circuits Conference—(ISSCC), San Francisco, CA, 2018, pp. 490-492.

Henzler, S., "Chapter 2, Time-to-Digital Converter Basics", Springer Series in Advanced Microelectronics 29, 2, Springer Science+Business Media B.V. 2010.

Kang, M., et al., "An In-Memory VLSI Architecture for Convolutional Neural Networks", http://ieee-cas.org/pubs/jetcas, Published Version DOI: 10.1109/JETCAS.2018.2829522, Publication Apr. 23, 2018, IEEE Circuits and Systems Society, 13 pages.

Mason, A., "Memory Basics", Michigan State, ECE 410, Chapter 13 Lecture Notes, pp. 13.1-13.34, 2010.

Solanki, Umang, "How does SRAM work?", https://www.quora.com/How-does-SRAM-work, Aug. 17, 2017, 2 pages.

Stone, Harold S. "A Logic-In-Memory Computer", IEEE Transactions on Computers, Jan. 1970, 6, pages.

Zhang, J., et al., "In-Memory Computation of a Machine-Learning Classifier in a Standard 6T SRAM Array," in IEEE Journal of Solid-State Circuits, vol. 52, No. 4, 10 pages, Apr. 2017.

* cited by examiner

US 10,642,922 B2

BINARY, TERNARY AND BIT SERIAL COMPUTE-IN-MEMORY CIRCUITS

FIELD

The descriptions are generally related to memory, and more particularly to compute-in-memory circuits for memory cell arrays.

BACKGROUND

Compute-in-memory (CIM) circuits can perform certain computing operations more quickly than a conventional digital processing system, in part by reducing the memory bottleneck between memory and processing units, referred to as the von Neumann bottleneck. For this reason, CIM circuits can be used to support computing intensive applications such as machine learning and artificial intelligence.

CIM circuits perform basic matrix-vector operations within a memory array directly, eliminating the need to transfer data to a compute engine. The basic matrix-vector operations can include operations such as dot-product and absolute difference of vectors. CIM circuits based on analog operations allow for lower cost computation and higher effective memory bandwidth.

BRIEF DESCRIPTION OF THE DRAWINGS

The described embodiments are illustrated by way of example and not limitation in the figures of the accompanying drawings, in which like references indicate similar elements and in which.

Figure 1:
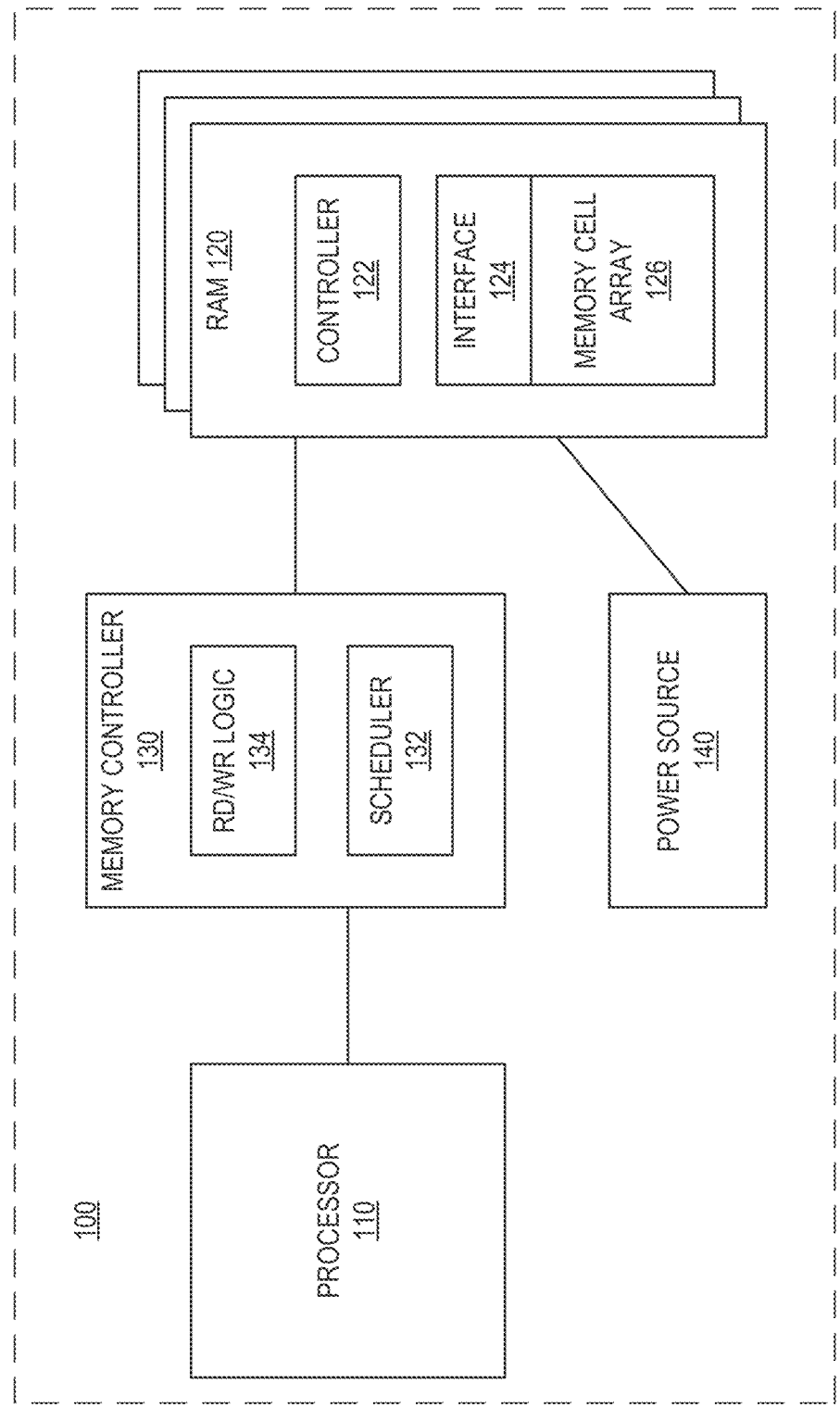
FIG. 1 is a schematic block diagram of a memory device that includes a memory cell array configured as a binary compute-in-memory circuit in accordance with various examples described herein.

Other features of the described embodiments will be apparent from the accompanying drawings and from the detailed description that follows.

DETAILED DESCRIPTION

In a CIM circuit a weight matrix is stored within the memory cells of a memory array. An input vector is used to modulate pulsing the wordlines of the memory array to compute a dot product of the input vector and the stored weight matrix using analog voltages. The output of the matrix-vector dot product is determined from the read voltages of the bitlines of the memory array. Previous attempts to use a CIM circuit for such computations have relied on techniques to weight the input vector using variable pulse widths or precharge the bitlines such that the memory cells have a non-uniform weighted effect on the bitline voltages from which the output is determined. Some implementations have drawbacks, including limitations on the types of dot product operations that can be performed, or limitations on the types of SRAM bitcells that can be used in the memory cells of the memory array.

Depending on the practical minimum wordline pulse width and the capacitance of the bitline, the total number of wordlines that are activated at once may have to be limited to avoid bitline voltage saturation due to limited allowable bitline voltage swing. If the value of the dot product is large, the bitline voltage may swing below its allowable range causing the memory cells to no longer be well-approximated by a current source. Also, if the bitlines swing low enough, a read upset can occur causing the bitcell values to flip state. Variable pulse widths on the wordlines can further introduce noise that adversely affects the performance of a CIM circuit. The non-uniform weighted effects on the memory cells and resulting bitline voltages can also be adversely affected such that the output cannot be reliably determined.

A binary CIM circuit configured in accordance with the various examples as herein described enables all memory cells in a memory array to be effectively accessible simultaneously for computation using fixed pulse widths on the wordlines and equal capacitance on the bitlines. Memory cells that have an effect on the bitline voltage greater than one least significant bit (LSB) of voltage swing necessarily means that fewer bits can be read out from memory. In contrast, embodiments of a binary CIM circuit use the fixed pulse widths and equal capacitance ensure that a minimum voltage drop in the bitline represents one least significant bit (LSB) to maximize the effective memory bandwidth of a memory array for a given maximum voltage range of bitline voltage, and further ensure that the bitline voltage swing remains safely within its maximum allowable range.

In one embodiment, matrix-vector operations occur completely within the binary CIM circuit using analog computation. In one embodiment, the binary CIM circuit can be further configured to support binary, ternary, and multibit inputs and weights using a switch capacitor network to further process the bitline voltage outputs generated during the analog computation.

For example, in one embodiment, the bitline voltage outputs of the binary CIM circuit can further be summed together in the analog domain by using a switch capacitor network that includes a switch capacitor charge sharing circuit of column switch capacitors and shorting switches. In another example, after each bitline voltage is deposited onto a corresponding column switch capacitor, a bitline switch can be disconnected and one or more column switch capacitors shorted together so that the final voltage settles to the average bitline voltage across all column switch capacitors. In one embodiment the bitline voltage outputs of the binary CIM circuit can further be accumulated with additional column switch capacitors to support bit serial accumulation operations.

In one embodiment, multiple banks of memory arrays can also be used in parallel, and their outputs can further be averaged with the same switch capacitor charge sharing circuits, where the switch capacitor charge sharing and bit serial accumulation is between banks as opposed to columns.

In one embodiment, the CIM circuit can be combined with column or row multiplexing. For example, row multiplexing can be used to allow the circuits generating wordline pulses to be larger than one row height. In another embodiment, N number of row-access generating circuits can be laid out together as a block in a compact manner pitch matching the height of N number of rows instead of row-multiplexing for faster row access. Similarly, column multiplexing can be used to share switch capacitors and analog to digital converters (ADCs) across multiple columns so the shared circuits can be wider than a single SRAM bitcell.

Examples of an apparatus, system and method are described herein for a binary CIM circuit enabling all or a portion of memory cells in a memory array to be effectively accessible simultaneously for computation. The apparatus, system and method enable the memory cells in the memory array to be effectively accessible simultaneously for computation using fixed pulse widths and equal capacitance. The apparatus, method and system are further configured to support binary, ternary, and multibit inputs and weights using a switch capacitor network.

In the description that follows, examples may include subject matter such as a method, a process, a means for performing acts of the method or process, an apparatus, a memory device, a system, and at least one machine-readable tangible storage medium including instructions that, when performed by a machine or processor, cause the machine or processor to performs acts of the method or process according to embodiments and examples as described herein.

Numerous specific details are set forth to provide a thorough explanation of embodiments of the methods, media, apparatus, processes and systems for a binary CIM circuit to support compute-in-memory operations on a memory cell array. It will be apparent, however, to one skilled in the art, that an embodiment can be practiced without one or more of these specific details. In other instances, well-known components, structures, and techniques have not been shown in detail so as to not obscure the understanding of this description.

Reference in the specification to "one embodiment" or "an embodiment" means that a particular feature, structure, or characteristic described in connection with the embodiment can be included in at least one embodiment. The appearances of the phrase "in one embodiment" in various places in the specification do not necessarily all refer to the same embodiment.

The methods, processes and logic depicted in the figures that follow can comprise hardware (e.g. circuitry, dedicated logic, controllers, etc.), software (such as is run on a general-purpose computer system or a dedicated machine, e.g. a software module or logic), and interfaces (such as a memory interface) between hardware and software, or a combination of both. Although the processes and logic are described below in terms of some sequential operations, it should be appreciated that some of the operations described can be performed in a different order. Moreover, some operations can be performed in parallel rather than sequentially.

FIG. 1 is a schematic block diagram of a memory device that includes a memory cell array that can be used in a binary compute-in-memory (CIM) circuit in accordance with various examples described herein. System 100 includes components of a memory subsystem having random access memory (RAM) 120 to store and provide data in response to operations of processor 110. System 100 receives memory access requests from a host or a processor 110, which is processing logic that executes operations based on data stored in RAM 120 or generates data to store in RAM 120. Processor 110 can be or include a host processor, central processing unit (CPU), microcontroller or microprocessor, graphics processor, peripheral processor, application specific processor, or another processor, and can be single core or multicore.

System 100 includes memory controller 130, which represents logic to interface with RAM 120 and manage access to data stored in the memory. In one embodiment, memory controller 130 is integrated into the hardware of processor 110. In one embodiment, memory controller 130 is stand-alone hardware, separate from processor 110. Memory controller 130 can be a separate circuit on a substrate that includes the processor. Memory controller 130 can be a separate die or chip integrated on a common substrate with a processor die (e.g., as a system on a chip (SoC)). In one embodiment, memory controller 130 is an integrated memory controller (iMC) integrated as a circuit on the processor die. In one embodiment, at least some of RAM 120 can be included on an SoC with memory controller 130 and/or processor 110.

In one embodiment, memory controller 130 includes read/write logic 134, which includes hardware to interface with RAM 120. Logic 134 enables memory controller 130 to generate read and write commands to service requests for data access generated by the execution of instructions by processor 110. In one embodiment, memory controller 130 includes scheduler 132 to schedule the sending of access commands to RAM 120 based on known timing parameters for read and write access for RAM 120. Known timing parameters can be those that are preprogrammed or otherwise preconfigured into system 100. Such parameters can be stored in RAM 120 and accessed by memory controller 130. In one embodiment, at least some parameters are determined by synchronization procedures. The timing parameters can include the timing associated with write latency for RAM 120. The write latency for RAM 120 can depend on the type of memory technology. In one embodiment, RAM 120 can be a static RAM (SRAM) memory cell capable of supporting compute-in-memory operations on memory cell array 126.

In one embodiment, RAM 120 includes interface 124 (e.g., interface logic) to control the access to memory cell array 126. Interface 124 can include decode logic, including logic to address specific rows or columns or bits of data. In one embodiment, interface 124 includes logic to control the amount of current provided to specific memory cells of memory device array 126. Thus, control over writing to memory cell array 126 can occur through driver and/or other access logic of interface 124. Controller 122 represents an on-die controller on RAM 120 to control its internal operations to execute commands received from memory controller 130. For example, controller 122 can control any of timing, addressing, I/O (input/output) margining, scheduling, and error correction for RAM 120.

In one embodiment, controller 122 is configured to read and write memory cell array 126 in accordance with any embodiment described herein. In one embodiment, controller 122 can differentiate between different logic-states as a consequence of the programming polarity of a memory cell. For example, in one embodiment, controller 122 can read a memory cell by applying a voltage drop via interface 124 to the memory cell to determine the state (e.g., a higher stable state or lower stable state) of the memory cell.

In one embodiment, when controller 122 is to write to a memory cell, controller 122 applies a quick pulse to the memory cell to program the polarity of the memory cell. In one such embodiment, programming in forward polarity will put the cell in one state (e.g., a lower threshold state) and programming in reverse polarity will put the cell in the other state (e.g., a higher threshold state). For example, in one embodiment, controller 122 applies a pulse in one polarity (e.g., bitline positive and wordline negative) to write a value (e.g., a '1') or in the other polarity (e.g., bitline negative and wordline positive) to write another value (e.g., a '0'). In one such embodiment, controller 122 applies a pulse that is sufficient to trigger the cell in its higher or lower stable state. System 100 includes power source 140, which can be a voltage source or regulator that provides power to RAM 120. Controller 122 and interface 124 can use the power available from power source 140 to apply a voltage drop to access a memory cell of array 126.

Figure 2:
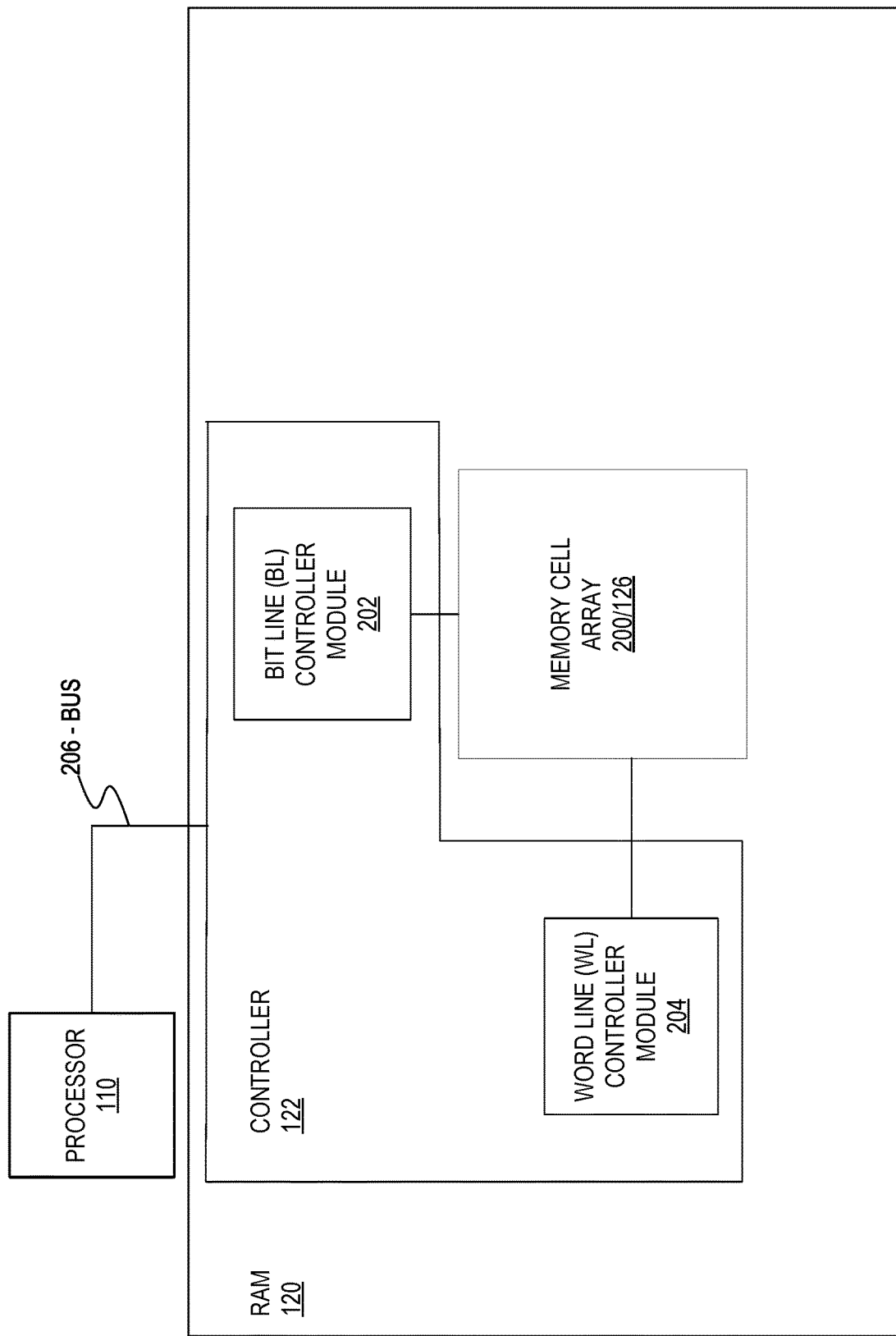
FIG. 2 is a schematic block diagram of further details of a memory device that includes a memory cell array configured as a binary compute-in-memory circuit in accordance with various examples described herein.

FIG. 2 is a schematic block diagram of further details of a memory device that includes a binary compute-in-memory (CIM) circuit in accordance with various examples described herein. The processor 110 communicates via bus 206 with RAM 120 via controller 122. Memory cell array 200 includes a plurality of memory cells that are accessible via a plurality of word lines ("WL"), a plurality of bit lines ("BL") 206. Memory cell array 200 is configured to store data and may be written to (i.e., programmed) or read from. Each memory cell includes a memory element configured to store information such as a weight of a weight matrix used in a machine learning algorithm to support compute-in-memory operations on the memory cell array 200.

Memory controller 122 includes WL control module 204 and BL control module 202. Memory controller 122 is configured to initiate and manage accessing the memory cell array 200 to carry out compute-in-memory operations. Memory controller 122 is further configured to manage operations of WL control module 204 and BL control module 202 to carry out the compute-in-memory operations as described herein.

Figure 3:
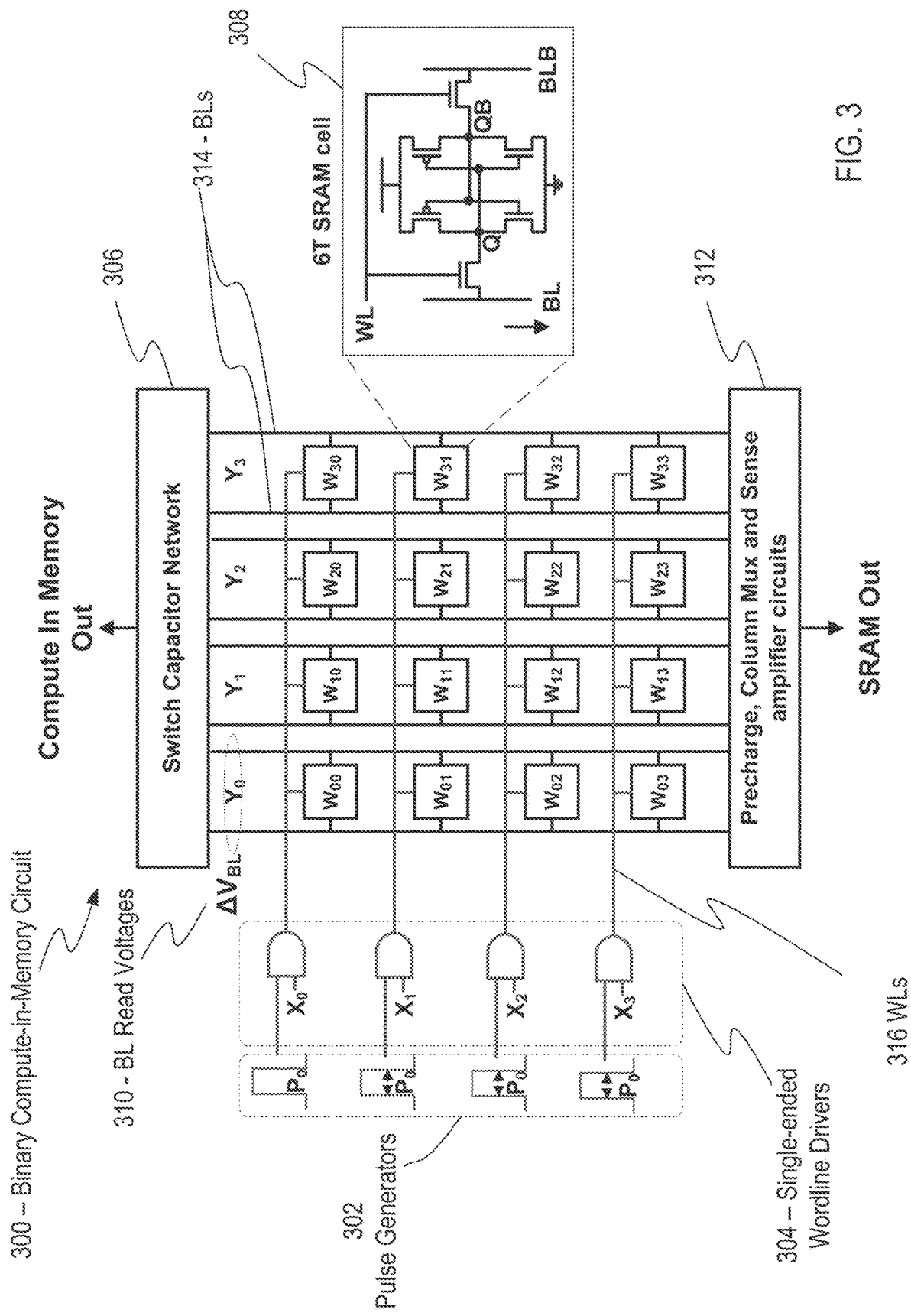
FIG. 3 illustrates a schematic view of a binary compute-in-memory circuit in accordance with various examples described herein.

FIG. 3 illustrates one embodiment of a binary CIM circuit 300 using a 6T SRAM cell 308. By way of example only, and not limitation, the memory cells comprise an array of memory cells for storing a binary weight matrix such as might be used in a machine learning application. Although the binary CIM circuit 300 is shown using an array of memory cells to store 4-bit weights of a 4×4 weight matrix, all or a portion of an array of memory cells could be used to store binary weights and weight matrices having other dimensions. In addition, although the binary CIM circuit 300 is shown using 6T SRAM cells 308, other types of memory cells could be used, such as an 8T SRAM cell, as long as the cell is capable of storing weights and driving the bitline voltages as described in the examples that follow.

In one embodiment, the binary CIM circuit includes single-ended wordline drivers $X_0, X_1, X_2, X_4$ 304 and one or more corresponding pulse generators, $P_0, P_1, P_2, P_4$ 302, to pulse the wordlines 304 to carry out the compute-in-memory operation. In one embodiment the single-ended wordline drivers $X_0, X_1, X_2, X_4$ 304 can share a single pulse generator P. As the memory cells are activated by the wordline pulse, the memory cells drive the bitlines 314. The voltage drops on the bitlines 314 caused by the activated memory cells are accumulated as BL Read Voltages 310 for each column of memory cells. Because each bitline 314 is configured with a fixed capacitance and each wordline driver pulses the wordlines with a fixed pulse, any given bitcell only has a minimum one LSB voltage step of effect on the final bitline voltage of a corresponding bitline. The memory cells act approximately as constant current sources enabled by the wordline, and the bitline acts as a capacitor that the memory cells discharge.

In the illustrated embodiment, the BL Read Voltages 310 represent $Y_0, Y_1, Y_2, Y_4$, the output analog voltage values that represent the result of the compute-in-memory operation. In one embodiment, values $Y_0, Y_1, Y_2, Y_4$ can be further processed in switch capacitor network 306 as will be described in further detail in FIGS. 4-8. In one embodiment, the binary CIM circuit 300 can be further configured with precharge, column mux and sense amplifier circuits 312 to support the compute-in-memory operations.

The mathematics of the matrix-vector equation carried out by the CIM circuit 300 can be represented by the example matrix-vector dot product operation [W] [X]=[Y], where W represents the weight matrix, X represents the input vector and Y represents the output vector, expressed using matrix notation as follows:

$$\begin{bmatrix} W_{00} & W_{01} & W_{02} & W_{03} \\ W_{10} & W_{11} & W_{12} & W_{13} \\ W_{20} & W_{21} & W_{22} & W_{23} \\ W_{30} & W_{31} & W_{32} & W_{33} \end{bmatrix} \begin{bmatrix} X_0 \\ X_1 \\ X_2 \\ X_3 \end{bmatrix} = \begin{bmatrix} Y_0 \\ Y_1 \\ Y_2 \\ Y_3 \end{bmatrix} \quad \text{(Eq. 1)}$$

As illustrated in FIG. 3, each of the weights comprising the weight matrix W is stored in CIM circuit 300 with the first matrix row of weights $W_{00}, W_{01}, W_{02}, W_{03}$ in the first column of the memory array in CIM circuit 300, $W_{10}, W_{11}, W_{12}, W_{13}$ in the next column and so forth. The compute-in-memory operation is performed in parallel after the single-ended wordline drivers $X_0, X_1, X_2, X_4$ 304 pulse the wordlines 316 to drive memory cells storing the binary weight matrix W resulting in the output voltage values $Y_0, Y_1, Y_2, Y_4$ 310 read from bitlines 314.

In one embodiment, the matrix-vector dot product is computed in memory using the binary CIM circuit 300 by first pre-charging the bitlines 314 similar to that of a conventional SRAM memory access, and then pulsing multiple wordlines 316 using wordline drivers $X_0, X_1, X_2, X_4$ 304 in parallel in accordance with the values of input vector X. In one embodiment, the wordline drivers 304 are single-ended wordline drivers controlled by pulse generators 302. In one embodiment, the input vector is used to modulate whether a pulse of a fixed duration is driven onto a wordline 316 using a wordline driver 304. In one embodiment, a wordline driver 304 generates a fixed pulse when the input vector at the corresponding position $X_0, X_1, X_2, X_4$ has a value of one, and generates no pulse when the value is zero.

Driving the wordlines corresponds to the multiplication part of a matrix-vector dot product operation, where $X_i$ is multiplied with W [x:n, y:m] per wordline row. The binary gating function for driving the wordlines can be implemented as AND gate as shown in FIG. 3, but can be any combination of gates with similar functionality such as an NAND or NOR gates.

In one embodiment, after driving the pulse onto the wordlines 316, the CIM circuit 300 uses sense circuits 312 to sense the drop in bitline voltage resulting in output voltage values $Y_0, Y_1, Y_2, Y_4$ 310. As previously noted when the wordlines $X_0, X_1, X_2, X_4$ are activated, the memory cells storing the binary weight matrix W cause the bitline voltage of the corresponding columns to drop. The bitline discharges only when both the input wordline is enabled (driven by a value of "1") and the stored value in the bitcell is a value of "1." The resulting change in bitline voltage is the sum of contributions from individual memory cells, and is read as the output voltage values $Y_0, Y_1, Y_2, Y_4$ referred to in FIG. 3 as the BL read voltages 310. The resulting change in bitline voltage $\Delta V_{BL}$ 310 represented by output voltage values $Y_0$, $Y_1$, $Y_2$, $Y_4$ corresponds to the accumulation part of the matrix-vector dot product. This bitline voltage can then be used for either analog computation in the switch capacitor network 306 or for digital computation after passing through an analog to digital converter (ADC, not shown).

As described thus far a single SRAM array in a binary CIM circuit 300 performs the matrix-vector dot product operation in parallel. The input vector X is used to enable the wordlines 304 of the SRAM array, and the weight matrix W is stored within the memory cells of the SRAM array. As will be described in further detail in the example embodiments in FIGS. 4-8, the outputs of each SRAM array column Y can further be summed together or otherwise processed in the analog domain by using the switch capacitor circuit 306.

Figure 4:
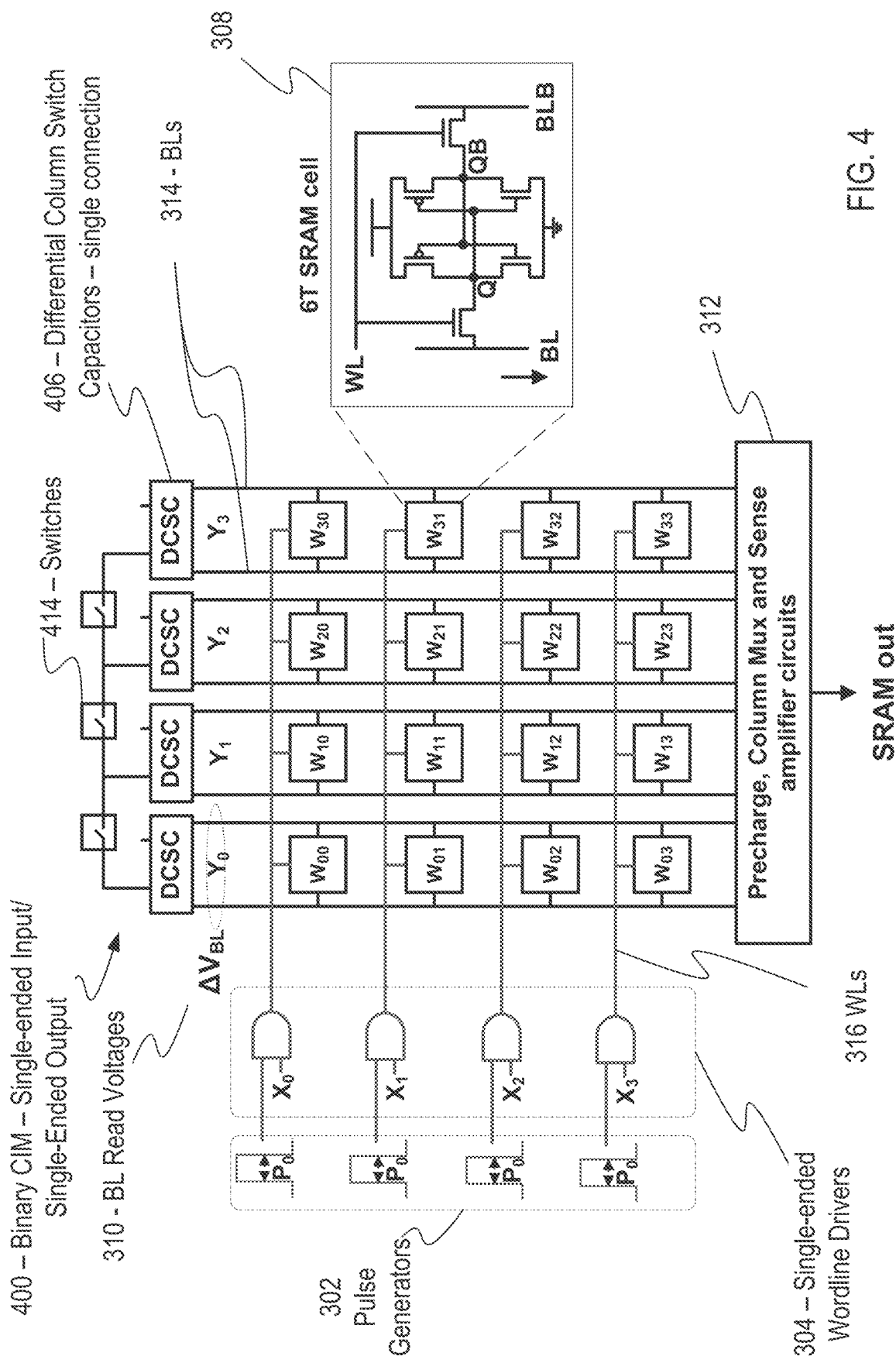
FIGS. 4, 5A-5B, 6, 7A-7C and -8 illustrate schematic views of various configurations of a binary compute-in-memory circuit in accordance with various examples described herein.

FIG. 4 illustrates the CIM circuit 300 of FIG. 3 in further detail. In particular, FIG. 4 illustrates an example of the switch capacitor network 306 that can be used with a single-ended input and single-ended output implementation of the CIM circuit 400. In this embodiment, multiple single-ended inputs X 304 are applied to the rows of a 6T SRAM bitcell 308 array containing binary weights W with the outputs Y 310 read out in parallel as BL Read voltages 310 from the column bitlines while ignoring the voltage on bitline_bar (BLB) of the bitcell 308, where the BLB is the rightmost bitline access transistor of a 6T SRAM bitcell 308 (or other type of SRAM, such as an 8T SRAM bitcell). In one embodiment, the binary CIM circuit 400 performs the vector dot product of a binary matrix W composed of [0, 1] with a binary vector X composed of [0, 1] to compute an output vector Y of positive integer values. In one embodiment, the column switch capacitors 406 sum the output vector Y of positive integer values to a scalar output Y using switches 414.

In one embodiment, the single-ended input/single-ended output CIM circuit 400 illustrated in FIG. 4 can be used to support multi-bit inputs X and multi-bit weights W by storing one or both of the input X and weight W as a thermometer code. For example, a thermometer code representing a 2-bit integer is set forth in Table 1 as follows:

TABLE 1

| Value | Thermometer Code(s) |
|---|---|
| 0 | 000 |
| 1 | 001, 010, or 100 |
| 2 | 011, 101, or 110 |
| 3 | 111 |

If the thermometer code (including any permutation of the thermometer code) of a single weight W is stored in the same memory row of the CIM circuit 400, all of the associated column bitline outputs with those memory cells are summed together by first connecting each column switch capacitor 406 to the bitlines 314 when the wordlines 316 are pulsed. Then, the bitlines 314 can be disconnected and the neighboring differential column switch capacitors (DCSC) 406 of the memory cells making up the single weight thermometer code can be shorted using switches 414 to obtain the voltage values representing the output vector Y. The mathematics of matrix-vector equation carried out by the CIM circuit 400 to obtain the voltage values representing the output vector Y for a weight W stored as a thermometer code can be expressed as follows:

$$[1 \ 1 \ 1] \begin{bmatrix} W_{00} & W_{10} & W_{20} \\ W_{01} & W_{11} & W_{21} \\ W_{02} & W_{12} & W_{22} \end{bmatrix} \begin{bmatrix} X_0 \\ X_1 \\ X_2 \end{bmatrix} = (x_0)(W_{00} + W_{01} + W_{02}) + \\ (x_1)(W_{10} + W_{11} + W_{12}) + (x_2)(W_{20} + W_{21} + W_{22})$$  (Eq. 2)

where $X_0$, $X_1$ and $X_2$ are one-bit binary inputs, and each W matrix value is a two-bit thermometer encoded weight. However, one drawback to storing the thermometer code of a single weight in the same memory row of the CIM circuit 400 is that only a single binary/ternary input vector X can be operated on per row.

In one embodiment, if a multibit weight W stored in each row of the Binary CIM circuit 400 is replicated across multiple columns then an input vector X that is also stored as a thermometer code can be used to multiply a multibit input vector X with a multibit weight W to obtain output vector Y. The mathematics of a matrix-vector equation carried out by the CIM circuit 400 to obtain the voltage values representing the output vector Y for a weight W and an input vector X that are both stored as thermometer codes can be expressed as follows:

$$[1 \ 1 \ 1] \begin{bmatrix} W_{00} & W_{00} & W_{00} \\ W_{01} & W_{01} & W_{01} \\ W_{02} & W_{02} & W_{02} \end{bmatrix} \begin{bmatrix} X_0 \\ X_1 \\ X_2 \end{bmatrix} = (x_0)(W_{00} + W_{01} + W_{02}) + \\ (x_1)(W_{00} + W_{01} + W_{02}) + (x_2)(W_{00} + W_{01} + W_{02})$$  (Eq. 3)

where the matrix $[X_2, X_1, X_0]$ represents a single value represented as a 3-bit thermometer code, such as the codes listed in Table 1, and $X_0$, $X_1$ and $X_2$ each represent two-bit binary inputs, and each W matrix value is a two-bit thermometer encoded weight that is replicated across the row.

One of the drawbacks to using the thermometer encoded scheme to iterate the binary CIM circuit 400 to compute a matrix-vector equation is that it is not scalable for high precision computation, either for storing the weight matrix W as a thermometer code or encoding the input vector X as a thermometer code. To achieve greater throughput and more compact use of the memory cells, additional embodiments of the binary CIM illustrated in FIGS. 3 and 4 are described in the following FIGS. 5-8.

Figure 5A:
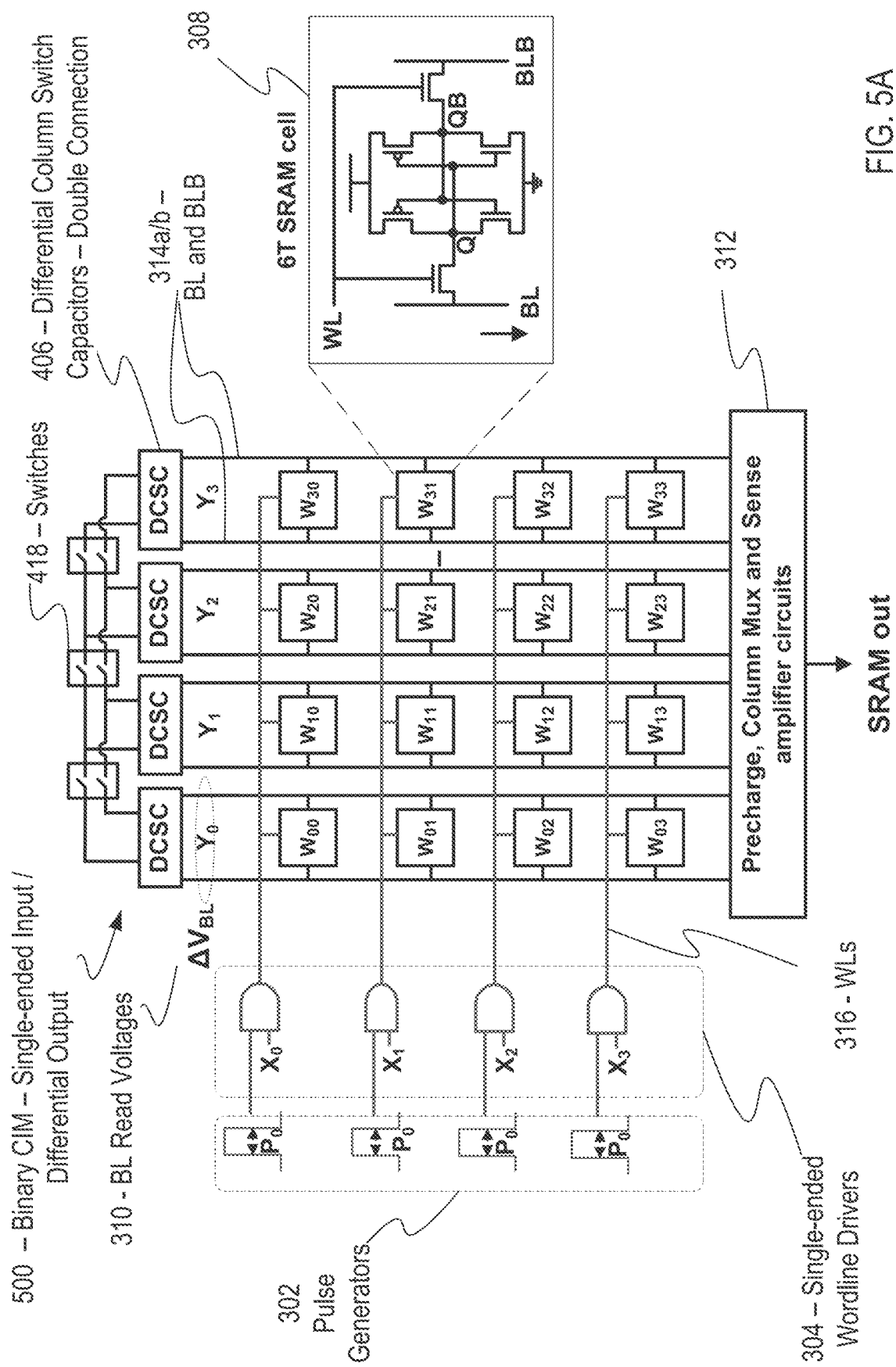

A binary CIM circuit 500 is provided as illustrated in FIG. 5A. In this embodiment, the single-ended input access (as previously described in FIGS. 3 and 4) is combined with a differential output using the differential column switch capacitors (DCSC) 406.

Figure 5B:
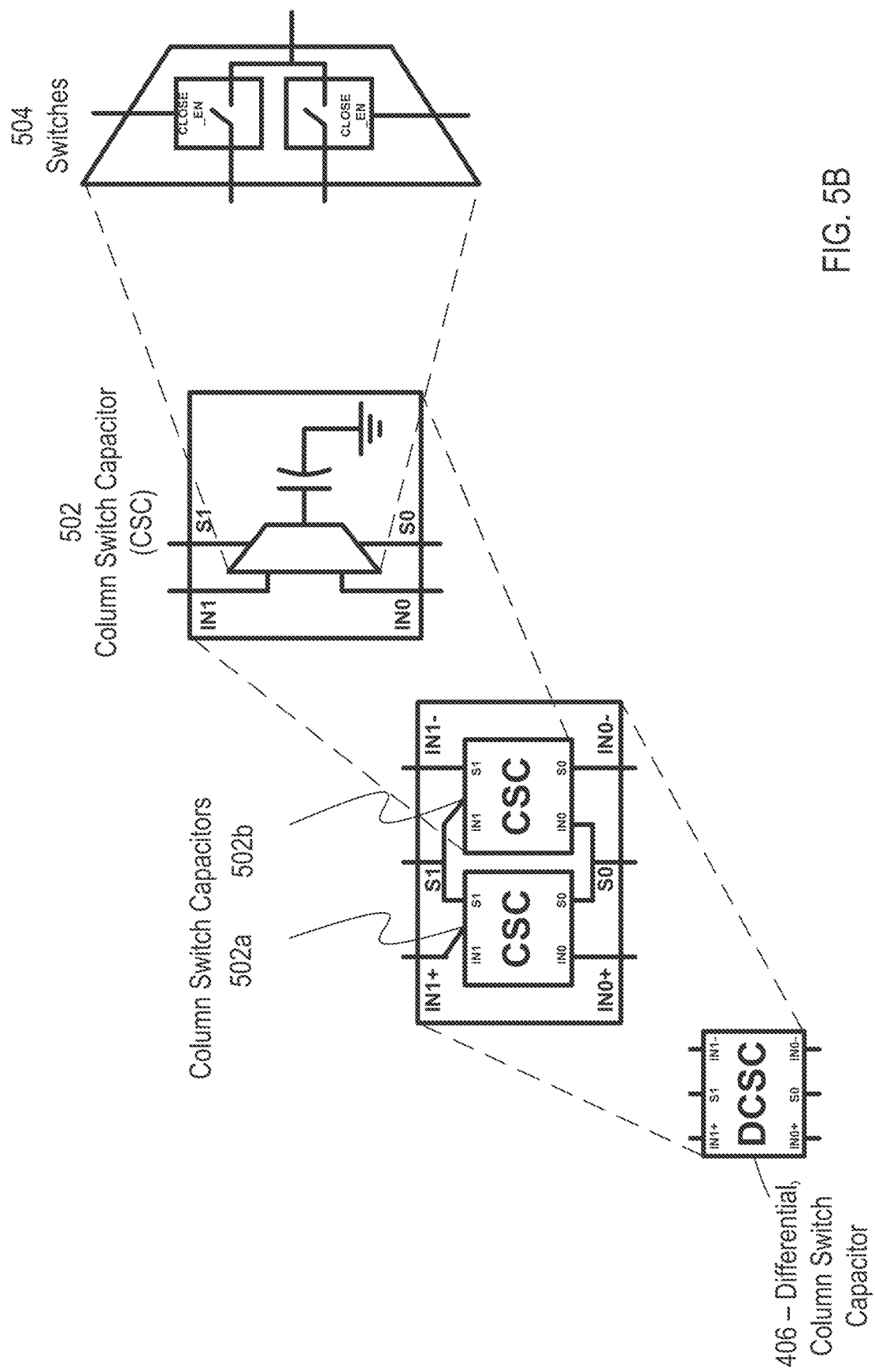

In this embodiment, the binary CIM 500 configured with single-ended input and differential output can be implemented with identical functionality to single-ended input and single-ended output binary CIM 300/400, but with double the voltage swing by reading both the bitline and bitline_bar 314 as a differential signal. With reference to FIGS. 5B and 5C, enlarged views of the differential capacitor switch network and components DCSC 406 are illustrated in greater detail. In one embodiment each DCSC 406 includes two column switch capacitors (CSC) 502a/502b each including switches 504 as shown in the enlarged views. A differential signal, also referred to as the differential bitline voltage 310, is sensed as the difference between the bitline voltage 314a and the bitline_bar voltage 314b using the DCSC 406 After the activation of the memory cells of the binary CIM 500, the differential bitline voltage 310 is summed through shorting switches 418 and charge sharing to generate a final read voltage representing an output scalar value for Y.

In one embodiment, doubling the dynamic range of the binary CIM 500 using a differential bitline voltage 310 increases the maximum resolution by one bit for a given analog to digital conversion (ADC) or analog operation limited by a noise source. Therefore, the matrix-vector operation carried out by the binary CIM 500 configured with single-ended input and differential output can be interpreted as an unsigned input X=[0, 1] multiplied with a signed binary weight W=[−1, 1] for a signed integer output Y=[ . . . , −2, −1, 0, 1, 2, . . . ]. In one embodiment, rather than using the differential column switch capacitor (DCSC) 406 to process the differential bitline voltages, an existing digital readout sense-amp circuit 312 functioning as a single bit ADC can quantize the differential bitline voltages to a single bit signed value Y=[−1, 1]. Digital quantization of the differential bitline voltages can be used as an activation function in deep neural network algorithms.

Figure 6:
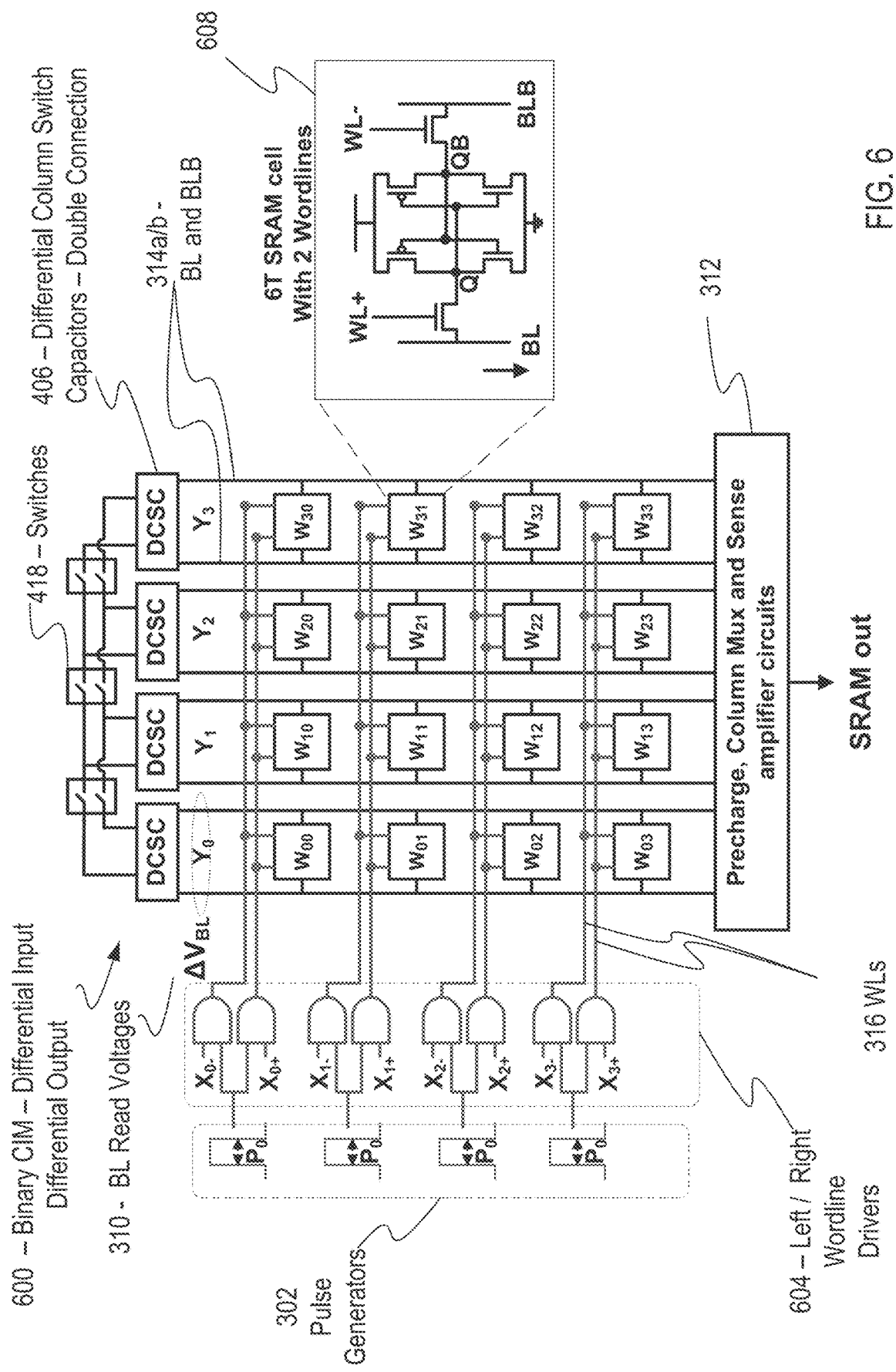

To provide even greater functionality when using binary CIM circuits, a binary CIM circuit 600 is provided as illustrated in FIG. 6. In one embodiment, the binary CIM circuit 600 is configured with modified memory cells providing access to two wordline access transistors, a wordline (WL+) and wordline bar (WL−) access transistors, such as illustrated in example modified 6T SRAM cell 608. In this variation, the memory cell still comprises a 6T SRAM bitcell, but separate wordline drivers 604 must be implemented for the left and right bitcell access transistor of each bitcell, i.e. the differential input, referred to herein as a wordline (left) and wordline_bar (right).

For example, in one embodiment, an input of value 1 is generated by pulsing the wordline and not pulsing wordline_bar. A signed input of value −1 is generated by pulsing the wordline_bar and not pulsing the wordline. An input value of 0 is generated by not pulsing either the wordline or wordline_bar. The following Table 2 summarizes the differential input values X+ and X−:

TABLE 2

| X+ | X− | Value |
| --- | --- | --- |
| 0 | 0 | 0 |
| 0 | 1 | −1 |
| 1 | 0 | +1 |
| 1 | 1 | 0 |

Similar to single-ended input and differential output, the binary CIM 600 configured with both differential input and differential output benefits from double the output voltage swing for higher resolution by reading both the bitline and bitline_bar 314 as a differential signal. In this embodiment the differential capacitor switch network comprising differential column switch capacitors (DCSC) 406 are the same as for the binary CIM 500, and the differential signal, also referred to as the differential bitline voltage 310, is sensed as the difference between the bitline voltage 314a and the bitline_bar voltage 314b (FIG. 5B).

In this embodiment, the matrix-vector operation carried out by the binary CIM 600 configured with both differential input and differential output can be interpreted as a dot product operation composed of a ternary input X=[−1, 0, 1] and a signed binary weight W=[−1, 1] to produce a signed integer output Y=[ . . . , −2, −1, 0, 1, 2, . . . ]. As with the binary CIM 500, rather than using the differential column switch capacitor to process the differential bitline voltages, the binary CIM 600 can be connected to an existing digital readout sense-amp circuit 312 functioning as a single bit ADC to quantize the differential bitline voltages to a single bit signed value Y=[−1, 1]. Digital quantization of the differential bitline voltages can be used as an activation function in deep neural network algorithms.

To provide support for multi-bit weights stored as a binary integer in a row of consecutive memory cells when using binary CIM circuits, a binary CIM circuit 700 is provided as illustrated in FIG. 7. As illustrated the binary CIM circuit 700 includes a single-ended input wordline driver 304 and weighted differential column switch capacitors (WDCSC) 706 to multiply a binary/ternary input with the multibit weight stored as a binary integer in a row of consecutive memory cells. In one embodiment, the total capacitance on each bitline 314 must remain constant across the columns in order for the voltage drop caused by any bitcell on any bitline 314 to be the same. However, during the charge sharing phase of operation, a binary weighted fraction of each total column switch capacitor is disconnected from the bitlines and shorted via switches 418 with neighboring columns making up the weight. The ratio of the column capacitances in the weighted differential column switch capacitors 706 provides the power of 2 weighting. Thus, as in the illustrated example, the output capacitance $C_{Out}$ of capacitors 706 are the values "1", "2," "4," and "8" in order from the least significant bit (LSB) column on the left to the most significant bit (MSB) column on the right.

In one embodiment, signed weights are also possible by incorporating a negation circuit 716 on the MSB column of every set of weighted column switch capacitors to invert the voltage before charge sharing. In addition, when the output voltages of the bitlines, i.e. the BL read voltages 310 $Y_0$, $Y_1$, $Y_2$ and $Y_3$ are sensed differentially, the negation circuit 716 is implemented by swapping differential output bitlines 314 using switches 418.

Figure 7A:
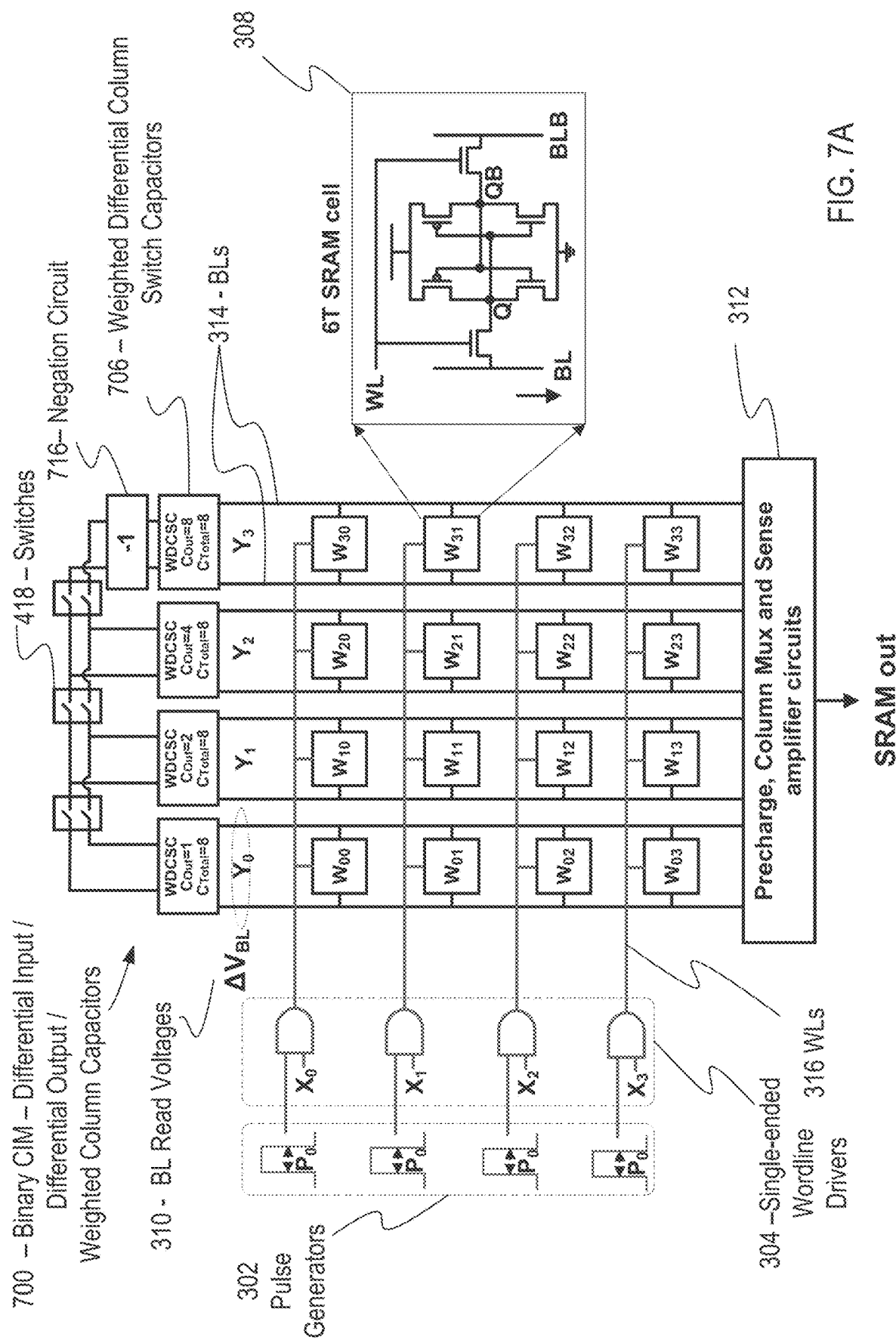
Figure 7B:
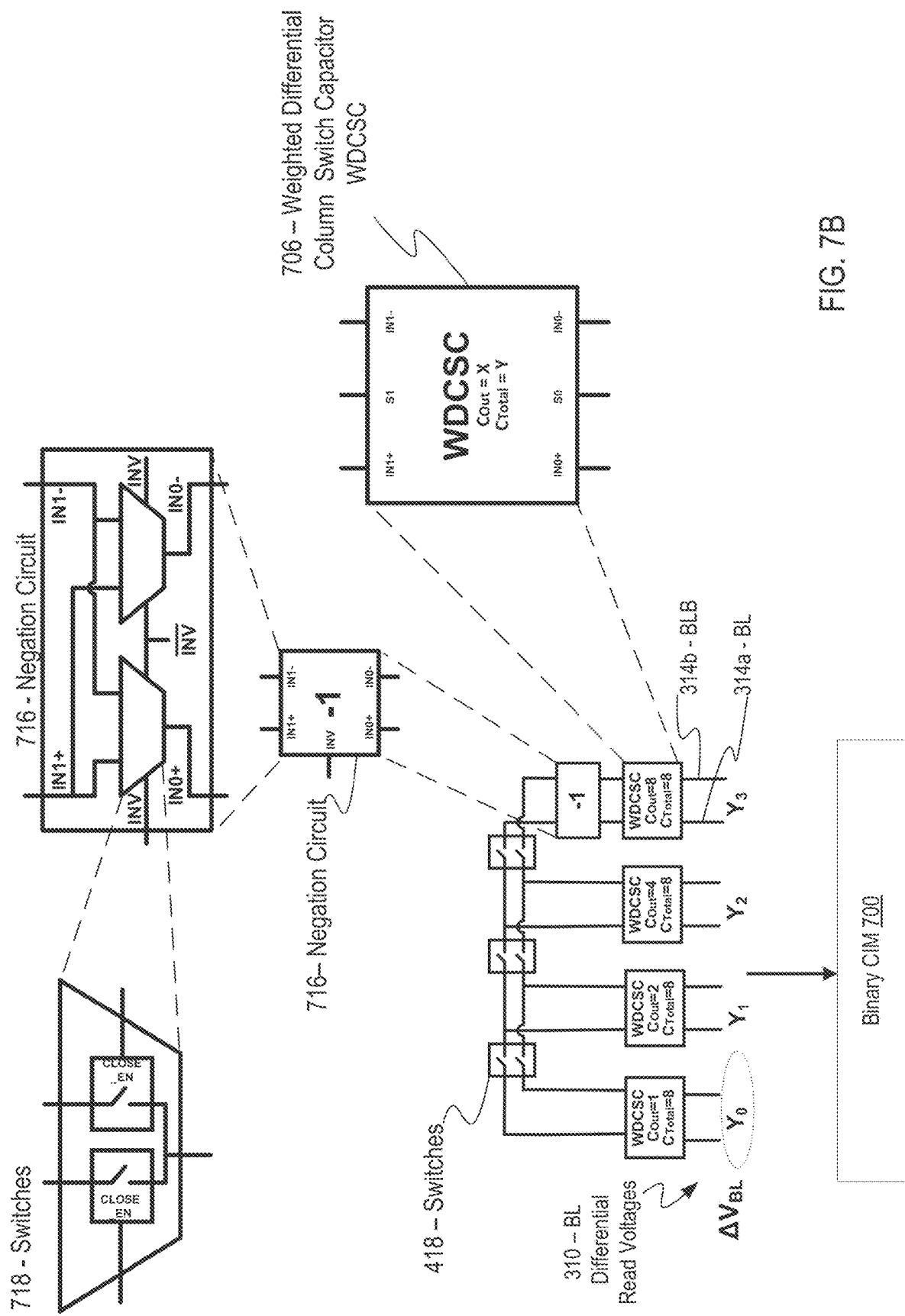
Figure 7C:
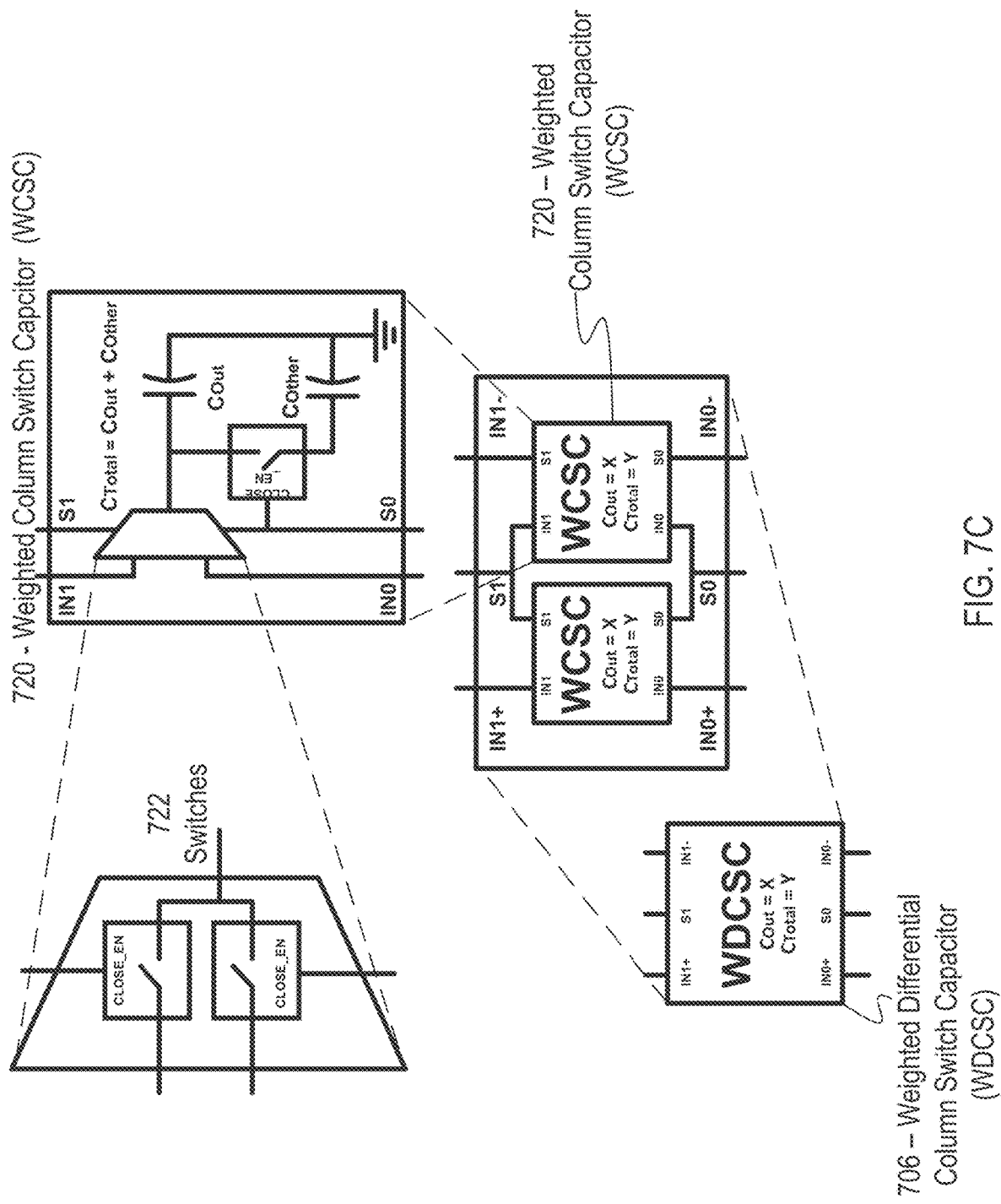

With reference to FIGS. 7B and 7C, enlarged views of the weighted differential capacitor switch network and components WDCSC 706 and negation circuit 716 are illustrated in greater detail. An exemplary WDCSC 706 component is illustrated in greater detail. As shown the WDCSC 706 includes weighted column switch capacitors (WCSC) 720 to weight the differential bitline voltages 310. The negation circuit 716 includes switches 718. As with the other binary CIMs having differential output, the differential signal, also referred to as the differential bitline voltage 310, is sensed as the difference between the bitline voltage 314a and the bitline_bar voltage 314b using the WDCSC 706 containing two WCSCs 720, each WCSC containing switches 722. After the activation of the memory cells of the binary CIM 700, the differential bitline voltage 310 is summed through shorting switches 418 and charge sharing to generate a final read voltage representing an output scalar value for Y. The negation circuit 716 is used to generate the signed weights through negating voltage drops on only the rightmost MSB of the weight as read from the rightmost differential bitline voltage 310. In one embodiment, for binary input vectors and binary stored weights, additional circuitry may be employed to programmatically control the shorting switches 418 to support different types of math operations.

Figure 8:
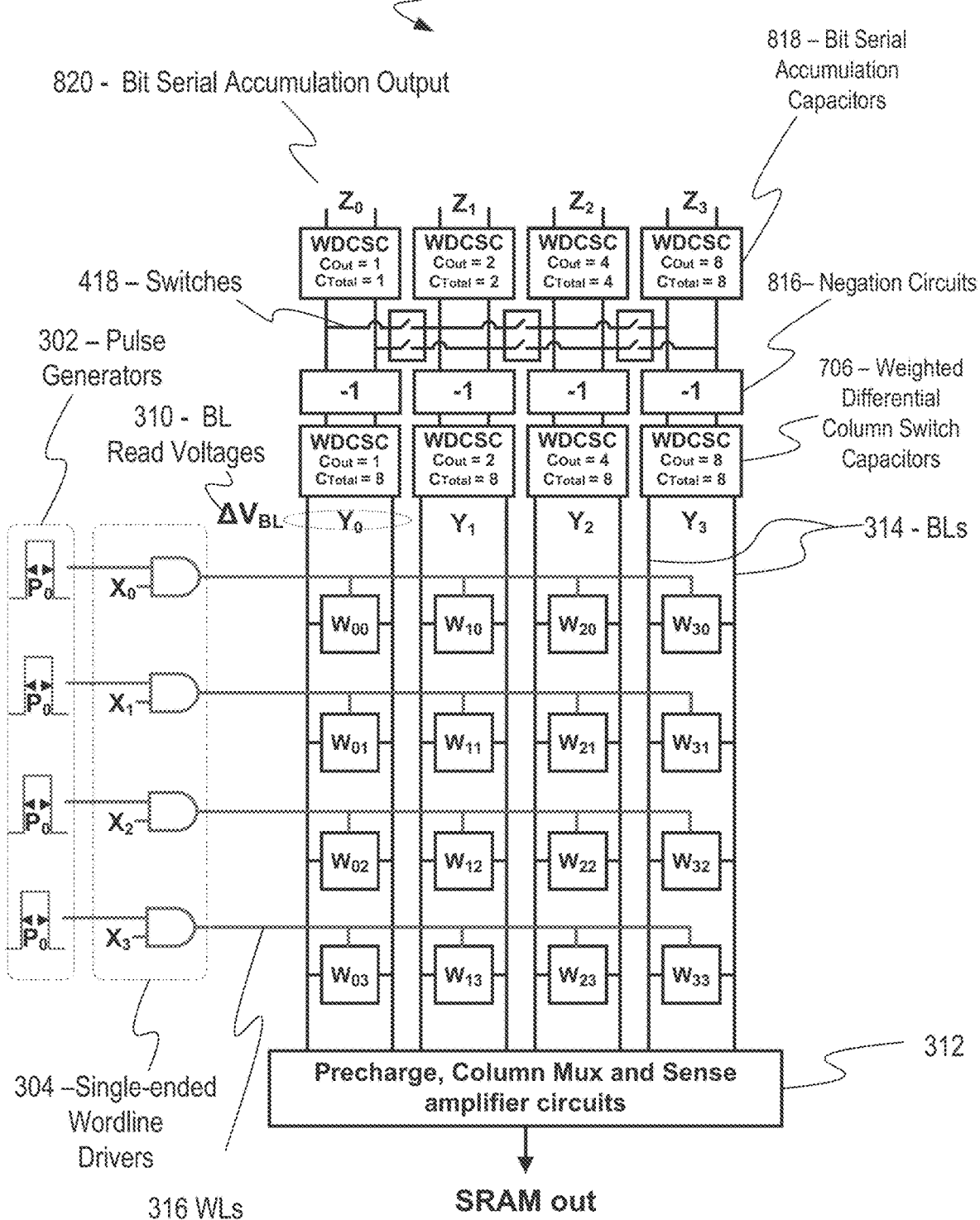

With reference to FIG. 8, to provide support for multi-bit integer inputs, a differential output binary CIM 800 can be used to serialize multiple binary operations and accumulate the result on an output capacitor. The binary CIM 800 is similar to the binary CIM 700 described with reference to FIG. 7A, but includes bit serial accumulation capacitors 818 in combination with the weighed differential column switch capacitors, and additional negation circuits 816 for each column switch capacitor, from the leftmost LSB to the rightmost MSB.

In one embodiment, the shifting and accumulation operations required for bit serial operation can either be performed in the digital domain, after the bitline voltage outputs 310 pass through an analog to digital converter (ADC, not shown), or completely in the analog domain. A digital bit serial operation allows for very high precision output calculation that is not affected by non-ideal analog computation and noise sources that occur after the bitline voltage outputs pass through an ADC. On the other hand, analog bit serial operation eliminates the need for an ADC to perform the bit serial operation in the digital domain.

Computationally, the analog bit serial operation is nearly equivalent to the digital bit serial operation except the "divide by 2" or "multiply by 2" operations that are necessary for bit serial operation can be performed in the analog voltage domain using switch capacitor circuits or analog amplifiers with fixed gain of "2" or "½." Using a switch capacitor "divide by 2" circuit to divide the output voltage in half is one of the lowest cost analog bit serial operations and can be readily implemented with two equal valued capacitors that are shorted together to preform voltage averaging ((a+b)/2).

Turning to the example bit serial operation illustrated in FIG. 8, the bit serial operation begins with the LSB of the binary input vector X from the single-ended wordline driver 304 at time $T_0$ on binary CIM 800 in which 4-bit weights have been stored. The output bitline read voltages 310, after charge sharing using WDCSCs 706, are stored on bit serial accumulation capacitors 818 sized to be equal to the output capacitance of the WDCSCs 706. At time T1, the next bit of the input is then processed by the binary CIM 800 and the weighted differential column switch capacitors 706 once again performs charge sharing with the bit serial accumulation capacitors 818. The charge sharing between the two equally sized capacitors performs averaging and functions as a type of "divided by 2" operation similar to that used in digital bit serial operation.

The analog bit serial operation on binary CIM 800 continues until the input vector's MSB is reached. In one embodiment, a signed input is implemented by performing the same process, but with the negation circuit 816. Specifically, the resulting output bitline voltage 310 from the operation of the binary CIM 800 using the input MSB is negated using negation circuit 816 after charge sharing by the weighted differential column switch capacitors 706, but before accumulation using the bit serial accumulation capacitors 818.

Using the illustrated example in FIG. 8, the single output scalar value Y resulting from four iterations, at times $T_0$, $T_1$, $T_2$, $T_3$, of binary CIM 800 performing the dot product of a 4-bit input vector X and 4-bit integer weights $W=-8W_{30}+4W_{20}+2W_{10}+W_{00}$, is equivalent to the following expression:

$$Y=-8Y_3+4Y_2+2Y_1+Y_0$$

In one embodiment, for a signed input, at times $T_0$, $T_1$, $T_2$, the negation circuit 816 is only activated for the rightmost MSB. During the last iteration, however, the converse is true, i.e. for a signed input at time $T_3$ the negation circuit 816 is activated for all of the leftmost LSBs and not activated for the rightmost MSB. The single accumulation output scalar $Z=Z_3=Z_2=Z_1=Z_0$ is obtained through successive bit serial accumulation operations at times $T_0$, $T_1$, $T_2$, $T_3$, is equivalent to the following expressions:

$$Z=Y[0]/2 \quad\quad T_0:$$

$$Z=Y[1]/2+Y[0]/4 \quad\quad T_1:$$

$$Z=Y[2]/2+Y[1]/4+Y[0]/8 \quad\quad T_2:$$

$$Z=Y[3]/2+Y[2]/4+Y[1]/8+Y[0]/16 \quad\quad T_3:$$

where Y[0] represents the value of the output scalar Y at time $T_0$, Y[1] represents the value of the output scalar Y at time $T_1$, Y[2] represents the value of the output scalar Y at time $T_2$, and Y[3] represents the value of the output scalar Y at time $T_3$.

Figure 9:
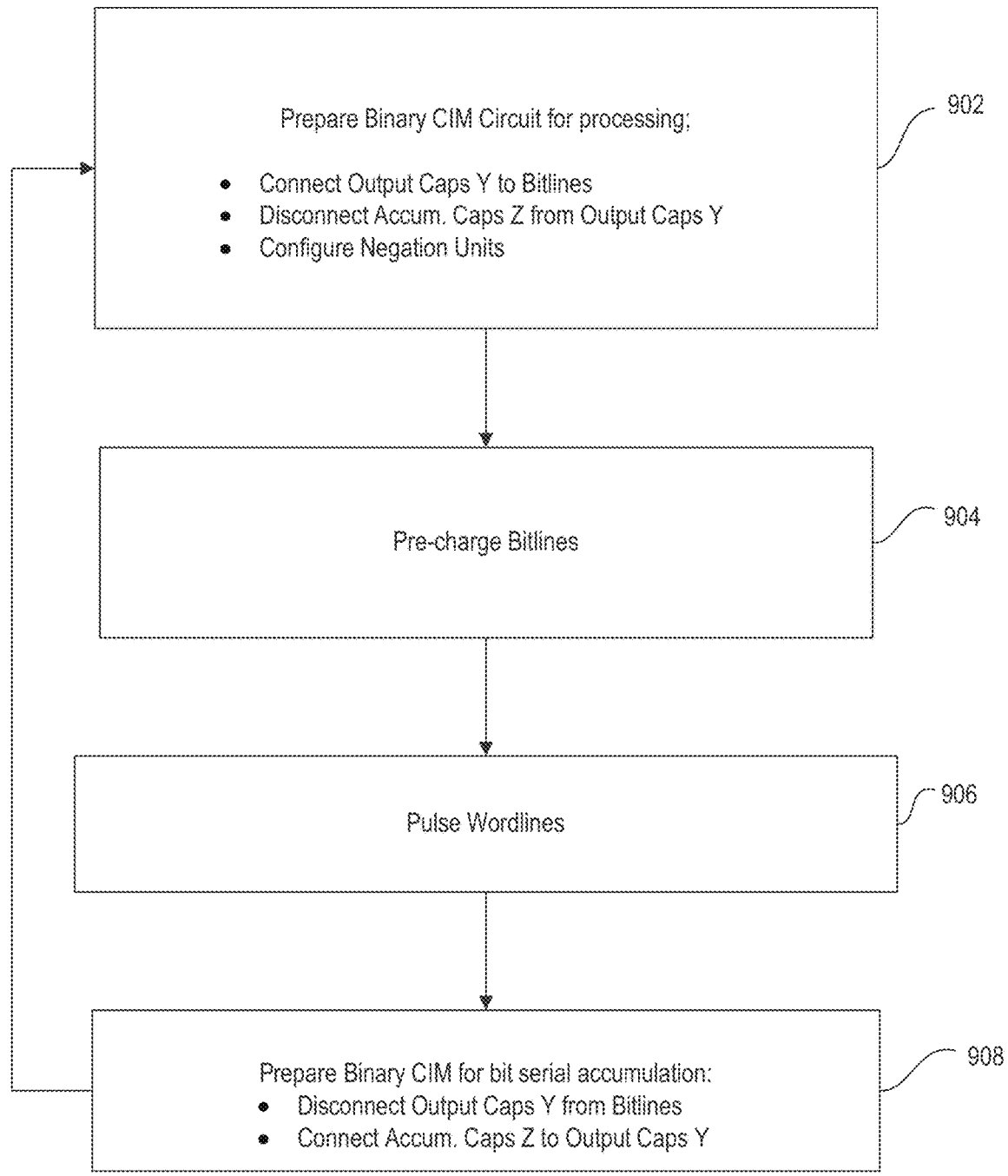
FIG. 9 is a flow diagram of a process for operating a binary compute-in-memory circuit in accordance with various examples described herein.

FIG. 9 illustrates an example process flow for processing multi-bit inputs with bit serial accumulation using the CIM circuit 800. At 902 the process 900 begins to prepare the binary CIM circuit by connecting the output capacitors, i.e., the weighted differential column switch capacitors 706 to the bitlines 314. The process 900 further disconnects the accumulation capacitors, i.e., the bit serial accumulation capacitors 818 from the output capacitors 706. Finally, the process configures the negation units 816 to prepare for a signed input vector X. At 904, the process precharges the bitlines 314, followed at 906 by pulsing the wordlines 304 to drive the bitlines 314 to their respective BL read voltages 310. At 908 the process 900 prepares the binary CIM 800 for bit serial accumulation by reversing the processes in 902, specifically disconnecting the output capacitors from the bitlines 314 for charge sharing the output value Y, and connecting the bit serial accumulation capacitors 818 to the output capacitors to accumulate Y into the bit serial accumulation value Z.

Figure 10:
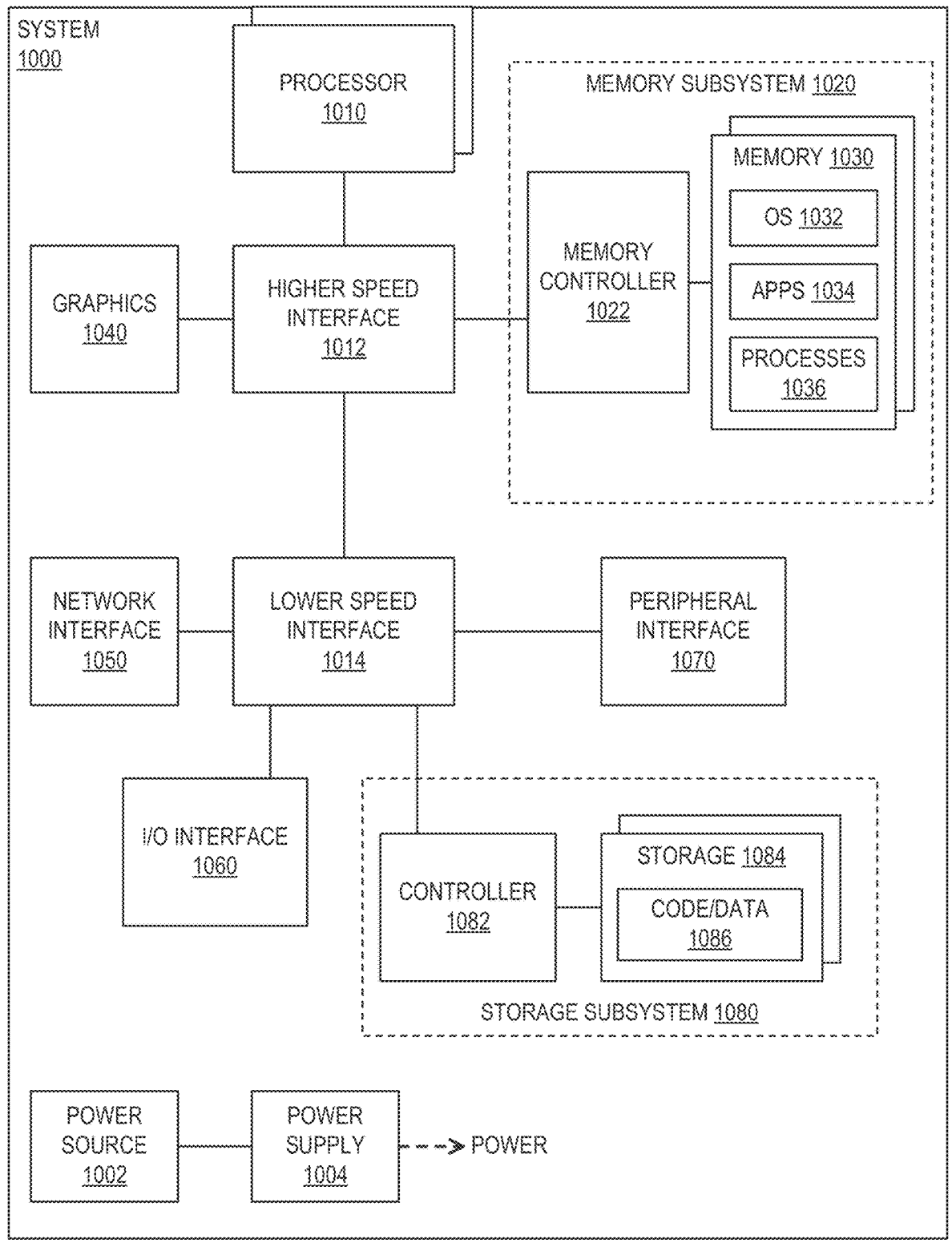
FIG. 10 is a schematic block diagram of a computing system in which a binary compute-in-memory circuit can be implemented in accordance with various examples described herein can be included.

FIG. 10 is a block diagram of a computing system in which a memory device having a binary CIM memory cell array can be included, in accordance with an embodiment. System 1000 represents a computing device in accordance with any embodiment described herein, and can be a laptop computer, a desktop computer, a server, a gaming or entertainment control system, a scanner, copier, printer, routing or switching device, embedded computing device, or other electronic device.

System 1000 includes processor 1010, which provides processing, operation management, and execution of instructions for system 1000. Processor 1010 can include any type of microprocessor, central processing unit (CPU), graphics processing unit (GPU), processing core, or other processing hardware to provide processing for system 1000, or a combination of processors. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 1000 includes interface 1012 coupled to processor 1010, which can represent a higher speed interface or a high throughput interface for system components that needs higher bandwidth connections, such as memory subsystem 1020 or graphics interface components 1040. Interface 1012 can represent a "north bridge" circuit, which can be a standalone component or integrated onto a processor die. Graphics interface 1040 interfaces to graphics components for providing a visual display to a user of system 1000. In one embodiment, graphics interface 1040 generates a display based on data stored in memory 1030 or based on operations executed by processor 1010 or both.

Memory subsystem 1020 represents the main memory of system 1000 and provides storage for code to be executed by processor 1010, or data values to be used in executing a routine. Memory subsystem 1020 can include one or more memory devices 1030 such as read-only memory (ROM), flash memory, one or more varieties of random access memory (RAM), or other memory devices, or a combination of such devices. Memory devices 1030 can include memory devices having memory cell arrays incorporating higher and lower resistivity materials as described herein.

Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide logic to provide functions for system 1000. In one embodiment, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire").

In one embodiment, system 1000 includes interface 1014, which can be coupled to interface 1012. Interface 1014 can be a lower speed interface than interface 1012. In one embodiment, interface 1014 can be a "south bridge" circuit, which can include standalone components and integrated circuitry. In one embodiment, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, USB (universal serial bus), or other wired or wireless standards-based or proprietary interfaces. Network interface 1050 can exchange data with a remote device, which can include sending data stored in memory or receiving data to be stored in memory.

In one embodiment, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one embodiment, system 1000 includes storage subsystem 1080 to store data in a nonvolatile manner. In one embodiment, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, or optical based disks, or a combination. Storage 1084 holds code or instructions and data 1086 in a persistent state (i.e., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (i.e., the value or state of the data is indeterminate if power is interrupted to system 1000). In one embodiment, storage subsystem 1080 includes controller 1082 to interface with storage 1084. In one embodiment controller 1082 is a physical part of interface 1014 or processor 1010, or can include circuits or logic in both processor 1010 and interface 1014.

Power source 1002 provides power to the components of system 1000. More specifically, power source 1002 typically interfaces to one or multiple power supplies 1004 in system 1000 to provide power to the components of system 1000. In one embodiment, power supply 1004 includes an AC to DC (alternating current to direct current) adapter to plug into a wall outlet. Such AC power can be renewable energy (e.g., solar power) power source 1002. In one embodiment, power source 1002 includes a DC power source, such as an external AC to DC converter. In one embodiment, power source 1002 or power supply 1004 includes wireless charging hardware to charge via proximity to a charging field. In one embodiment, power source 1002 can include an internal battery or fuel cell source.

Any methods, processes and logic depicted in the foregoing figures can comprise hardware (e.g. circuitry, dedicated logic, controllers, etc.), software (such as is run on a general-purpose computer system or a dedicated machine, e.g. a software module or logic), and interfaces (such as a memory interface) between hardware and software, or a combination of both. Although the processes and logic may have been described in terms of some sequential operations, it should be appreciated that some of the operations described can be performed in a different order. Moreover, some operations can be performed in parallel rather than sequentially.

While numerous specific details have been set forth to provide a thorough explanation of embodiments of the methods, media, apparatus, processes and systems for a full-rail digital-read CIM circuit, it will be apparent to one skilled in the art that an embodiment can be practiced without one or more of these specific details. In other instances, well-known components, structures, and techniques have not been shown in detail so as to not obscure the understanding of this description.

Reference in the foregoing specification to "one embodiment" or "an embodiment" means that a particular feature, structure, or characteristic described in connection with the embodiment can be included in at least one embodiment.

The appearances of the phrase "in one embodiment" in various places in the specification do not necessarily all refer to the same embodiment.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Additional example implementations are as follows:

Example 1 is any of a method, system, apparatus or computer-readable medium for an integrated circuit that includes a memory array of memory cells to store a binary weight matrix, a memory access circuit of bitlines having equal capacitance and wordlines driven with pulses of fixed duration to activate one or more memory cells in the memory array based on an input vector, wherein the memory access circuit to enable an activated bitcell in the memory array to cause a voltage drop in a bitline to which the activated bitcell is coupled, wherein the voltage drop is equivalent to voltage drops caused by other activated memory cells in the memory array, and a capacitor circuit coupled to the bitlines to accumulate bitline voltages after voltage drops into a voltage output, the voltage output to represent a dot product of the input vector and the binary weight matrix stored in the memory array.

Example 2 is any of the method, system, apparatus or computer-readable medium of Example 1 in which the memory access circuit includes a wordline driver to modulate the pulses of fixed duration based on the input vector, wherein the pulses to activate the one or more memory cells in the memory array based on binary weights of the binary weight matrix, the binary weights stored in the memory cells.

Example 3 is any of the method, system, apparatus or computer-readable medium of Examples 1 or 2 where the memory array is to store multibit binary weights as a thermometer weight scalar in a same memory row of the memory array and where the thermometer weight scalar is to enable the voltage output to represent the dot product of the input vector and the binary weight matrix with an increase in precision.

Example 4 is any of the method, system, apparatus or computer-readable medium of Examples 1, 2 or 3 where the memory access circuit is further to receive an input vector representing a multibit value stored as a thermometer input scalar, replicate binary weights of the binary weight matrix across multiple rows of the memory array of memory cells, the multiple rows corresponding to a dimension of the thermometer input scalar, and the wordline driver is to modulate the pulses of fixed duration across all of the multiple rows to enable the voltage output to represent the dot product of the input vector and the binary weight matrix with an increase in precision.

Example 5 is any of the method, system, apparatus or computer-readable medium of Examples 1, 2, 3 or 4, where the input vector represents a multibit integer input value and the capacitor circuit includes a bit serial accumulation capacitor to perform an analog bit serial accumulation operation for each bit of the multibit integer input value.

Example 6 is any of the method, system, apparatus or computer-readable medium of Examples 1, 2, 3, 4 or 5, where to perform the analog bit serial accumulation operation the capacitor circuit is to accumulate and shift values of output vectors obtained from dot products of each bit of a multibit integer input vector and the binary weight matrix, wherein accumulated and shifted values represent the dot product of the input vector and the binary weight matrix.

Example 7 is any of the method, system, apparatus or computer-readable medium of Examples 1, 2, 3, 4, 5 and 6, where the capacitor circuit includes a column switch capacitor coupled to a bitline to accumulate a bitline voltage after voltage drops caused by activated memory cells coupled to the bitline, an accumulated bitline voltage not exceeding an allowable voltage swing, and the accumulated bitline voltage represents a positive integer value of an output vector equal to the dot product of the input vector and the binary weight matrix.

Example 8 is any of the method, system, apparatus or computer-readable medium of Examples 1, 2, 3, 4, 5, 6 or 7, where the binary weights of the binary weight matrix include multibit binary weights stored as binary integers in a row of consecutive memory cells spanning multiple columns of the memory array, and the capacitor circuit includes a weighted column switch capacitor for each column of memory cells, the weighted column switch capacitor capable of charge sharing with neighboring capacitors spanning the multiple columns of the memory array, the capacitor circuit to disconnect a binary weighted fraction of each weighted column switch capacitor during charge sharing with neighboring capacitors, wherein the binary weighted fraction of each weighted column switch capacitor represents a ratio of weighted column switch capacitors across neighboring capacitors, the ratio based on a power of two.

Example 9 is any of the method, system, apparatus or computer-readable medium of Examples 1, 2, 3, 4, 5, 6, 7 or 8, where the bitlines of the memory access circuit include differential bitlines to double an allowable voltage swing caused by activated memory cells and the binary weights of the binary weight matrix include signed binary weights, where the activated bitcell in which a signed binary weight is stored is enabled to cause voltage drops to the differential bitlines and the capacitor circuit coupled to the differential bitlines includes a differential column switch capacitor for each column of the memory array, the differential column switch capacitor is to accumulate differential bitline voltages after voltage drops, an accumulated differential bitline voltage not exceeding a doubled allowable voltage swing, and to determine a differential voltage output between the accumulated differential bitline voltage, and further where the differential voltage output for each column of the memory array represents a signed integer value of an output vector equal to the dot product of the input vector and the binary weight matrix.

Example 10 is any of the method, system, apparatus or computer-readable medium of Examples 1, 2, 3, 4, 5, 6, 7, 8 or 9 where the input vector represents a ternary input value and a first pulse of fixed duration based on the input vector represents a ternary value of one, the first pulse to enable activated memory cells to cause voltage drops in a first one of the differential bitlines, a second pulse of fixed duration based on the input vector represents a ternary value of negative one, the second pulse to enable activated memory cells to cause voltage drops to a second one of the differential bitlines, and no pulse based on the input vector representing a zero ternary value to enable no memory cells to cause voltage drops to any of the differential bitlines.

Example 11 is any of the method, system, apparatus or computer-readable medium of Examples 1, 2, 3, 4, 5, 6, 7, 8, 9 or 10 where binary weights of the binary weight matrix include multibit binary weights stored as signed binary integers and the activated memory cells in which the signed binary integers are stored are enabled to cause voltage drops in the differential bitlines, and the capacitor circuit includes a negation circuit coupled to a column of the memory array corresponding to a bitcell in which a most significant bit of a multibit binary weight is stored, the negation circuit to invert an accumulated differential bitline voltage caused by the activated memory cells.

Example 12 is any of the method, system, apparatus or computer-readable medium of Examples 1, 2, 3, 4, 5, 6, 7, 8, 9, 10 or 11, where binary weights of the binary weight matrix include multibit binary weights stored as signed binary integers, wherein the activated memory cells in which the signed binary integers are stored are enabled to cause voltage drops in the differential bitline, and the capacitor circuit includes a weighted differential column switch capacitor coupled to a column of the memory array, the weighted differential column switch capacitor capable of charge sharing with neighboring capacitors spanning multiple columns of the memory array, the capacitor circuit further to disconnect a binary weighted fraction of each weighted differential column switch capacitor during charge sharing of neighboring capacitors, wherein the binary weighted fraction of each weighted differential column switch capacitor represents a ratio of weighted differential column switch capacitors across neighboring capacitors, the ratio based on a power of two, and where the capacitor circuit further includes a negation circuit to swap the differential voltage output for each column of the memory array.

Example 13 is any of the method, system, apparatus or computer-readable medium of Examples 1, 2, 3, 4, 5, 6, 7, 8, 9, 10, 11 or 12 where the memory cells of the memory array are any of a 6T SRAM and an 8T SRAM memory cell.

Example 14 is any of a method, system, apparatus or computer-readable medium for an integrated circuit a compute-in-memory (CIM) circuit, the CIM circuit including a computation circuit coupled to a memory array of memory cells for storing a binary weight matrix, where the computation circuit includes precharged bitlines of equal capacitance coupled to columns of memory cells of the memory array, wordlines coupled to rows of memory cells of the memory array, column switch capacitors coupled to the precharged bitlines of equal capacitance, where the computation circuit is to generate pulses of fixed duration across the rows of memory cells based on an input vector to the computation circuit, capture on the precharged bitlines an amount of voltage drop for memory cells that discharge to the precharged bitlines in response to the pulses of fixed duration, the amount of voltage drop for a bitcell equivalent to an amount of voltage drop for any other bitcell that discharges to the precharged bitlines, and accumulate, in the column switch capacitors, equivalent amounts of voltage drop on the precharged bitlines of equal capacitance, and further where an accumulated voltage drop on all the precharged bitlines represents a binary dot product of the input vector and the binary weight matrix.

Example 15 is any of the method, system, apparatus or computer-readable medium of Example 14 in which the memory cells of the memory array are any of a 6T SRAM and an 8T SRAM memory cell.

Example 16 is any of the method, system, apparatus or computer-readable medium of Examples 14 or 15 where the accumulated voltage drop on a bitline represents a positive integer value of an output vector equal to the dot product of the input vector and the binary weight matrix.

Example 17 is any of the method, system, apparatus or computer-readable medium of Examples 14, 15 or 16 in which binary weights of the binary weight matrix stored in the memory array include multibit binary weights stored in memory cells as binary integers in a row of consecutive memory cells spanning multiple columns of memory cells in the memory array, and a column switch capacitor of a column of memory cells includes a differential column switch capacitor having a pair of column switch capacitors to form a weighted differential column switch capacitor capable of charge sharing with neighboring capacitors spanning the multiple columns of memory cells in which a multibit binary weight is stored, where the computation circuit is to disconnect a binary weighted fraction of each weighted differential column switch capacitor during charge sharing with neighboring capacitors, wherein the binary weighted fraction of each weighted differential column switch capacitor represents a ratio of weighted differential column switch capacitors across neighboring capacitors, the ratio based on a power of two.

Example 18 is any of the method, system, apparatus or computer-readable medium of Examples 14, 15, 16 or 17 where the accumulated voltage drop on a bitline of equal capacitance is within an allowable voltage swing.

Example 19 is any of the method, system, apparatus or computer-readable medium of Examples 14, 15, 16, 17 or 18 where the bitlines of equal capacitance include bitline bars of equal capacitance doubling the allowable voltage swing for column of the memory array, the binary weights of the binary weight matrix stored in the memory array include signed binary weights, where a bitcell storing a signed binary weight to discharge to a bitline and a bitline bar, and a column switch capacitor includes a differential column switch capacitor having a pair of column switch capacitors coupled to the bitline and the bitline bar for a column of memory cells, where the computation circuit is to determine a differential voltage between a bitline voltage and a bitline bar voltage for the column of memory cells, the bitline voltage and the bitline bar voltage each based on respective accumulated equivalent voltage drops within a doubled allowable voltage swing, and where the differential voltage for each column of memory cells represents a signed integer value of an output vector equal to the dot product of the input vector and the binary weight matrix.

Example 20 is any of the method, system, apparatus or computer-readable medium of Examples 14, 15, 16, 17, 18 or 19, where the binary weights of the binary weight matrix stored in the memory array include multibit binary weights stored as signed binary integers, wherein a bitcell storing a signed binary integer discharges to a bitline and a bitline bar for a column of memory cells, and the column switch capacitor includes a negation circuit for a column in the memory array corresponding to the bitcell storing a most significant bit of the multibit binary weight, the negation circuit to invert the differential voltage for the column corresponding to the bitcell storing the most significant bit.

Example 21 is any of the method, system, apparatus or computer-readable medium of Examples 14, 15, 16, 17, 18, 19 or 20, where the input vector represents a ternary input value and the computation circuit further includes a pulse generator to generate a first pulse of fixed duration based on the input vector representing the ternary input value of one, the first pulse to enable memory cells to discharge only to the bitline and not the bitline bar, a second pulse of fixed duration based on the input vector representing the ternary input value of negative one, the second pulse to enable memory cells to discharge only to the bitline bar and not the bitline, and no pulse based on the input vector representing the ternary input value of zero and no discharge of any memory cells to either the bitline or bitline bar.

Example 22 is any of the method, system, apparatus or computer-readable medium of Examples 14, 15, 16, 17, 18, 19, 20 or 21 where the binary weights of the binary weight matrix stored in the memory array include signed binary integers stored in a row of consecutive memory cells spanning multiple columns, wherein memory cells in which the signed binary integers are stored discharge to a bitline and a bitline bar, the differential column switch capacitor includes a weighted differential column switch capacitor for a column of memory cells, the weighted differential column switch capacitor is capable of charge sharing with neighboring capacitors spanning the multiple columns in which a multibit binary weight is stored, and the computation circuit is further to disconnect a binary weighted fraction of the differential column switch capacitor during charge sharing of neighboring differential column switch capacitors, where the binary weighted fractions represent a ratio of column capacitors across neighboring differential column switch capacitors, the ratio based on a power of two, and where the computation circuit further includes a negation circuit to swap the differential voltage of the columns of the memory array.

Example 23 is any of the method, system, apparatus or computer-readable medium of Examples 14, 15, 16, 17, 18, 19, 20, 21 or 22 where the input vector represents a multibit integer input value, and the computation circuit includes a bit serial accumulation capacitor to perform an analog bit serial accumulation operation for each bit of the multibit integer input value.

Example 24 is any of a method, system, apparatus or computer-readable medium for an integrated circuit that includes a processor, a memory device communicatively coupled with the processor, the memory device including a compute-in-memory (CIM) circuit, the CIM circuit including a computation circuit coupled to a memory array, the computation circuit including a memory array of memory cells to store a binary weight matrix, a memory access circuit of bitlines having equal capacitance and wordlines driven with pulses of fixed duration based on an input vector, the pulses to activate one or more memory cells in the memory array, where the memory access circuit is to enable an activated bitcell in the memory array to cause a voltage drop in a bitline to which the activated bitcell is coupled and the voltage drop is equivalent to voltage drops caused by other activated memory cells in the memory array.

Example 25 is any of a method, system, apparatus or computer-readable medium of Example 24, where the integrated circuit further includes a capacitor circuit coupled to the bitlines to accumulate bitline voltages after voltage drops into a voltage output, the voltage output to represent a binary dot product of the input vector and the binary weight matrix stored in the memory array.

Example 26 is any of a method, system, apparatus or computer-readable medium of Example 24 or 25, where the memory access circuit includes a wordline driver to modulate the pulses of fixed duration based on the input vector, where the pulses to activate the one or more memory cells in the memory array is based on binary weights of the binary weight matrix, the binary weights stored in the memory cells.

Example 27 is any of a method, system, apparatus or computer-readable medium of Example 25 or 26, where the capacitor circuit includes a column switch capacitor coupled to a bitline to accumulate a bitline voltage after voltage drops caused by activated memory cells coupled to the bitline, where an accumulated bitline voltage not exceeding an allowable voltage swing, and further where the accumulated bitline voltage represents a positive integer value of an output vector equal to the dot product of the input vector and the binary weight matrix.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An integrated circuit comprising:
   a memory array of memory cells to store a binary weight matrix;
   a memory access circuit of bitlines having equal capacitance and wordlines driven with pulses of fixed duration to activate one or more memory cells in the memory array based on an input vector, wherein the memory access circuit to enable an activated bitcell in the memory array to cause a voltage drop in a bitline to which the activated bitcell is coupled, wherein the voltage drop is equivalent to voltage drops caused by other activated memory cells in the memory array; and
   a capacitor circuit coupled to the bitlines to accumulate bitline voltages after voltage drops into a voltage output, the voltage output to represent a dot product of the input vector and the binary weight matrix stored in the memory array.

2. The integrated circuit of claim 1, the memory access circuit including a wordline driver to modulate the pulses of fixed duration based on the input vector, wherein the pulses to activate the one or more memory cells in the memory array based on binary weights of the binary weight matrix, the binary weights stored in the memory cells.

3. The integrated circuit of claim 2, wherein the memory array is to store multibit binary weights as a thermometer weight scalar in a same memory row of the memory array, wherein the thermometer weight scalar is to enable the voltage output to represent the dot product of the input vector and the binary weight matrix with an increase in precision.

4. The integrated circuit of claim 2, wherein the memory access circuit is further to:
   receive an input vector representing a multibit value stored as a thermometer input scalar;
   replicate binary weights of the binary weight matrix across multiple rows of the memory array of memory cells, the multiple rows corresponding to a dimension of the thermometer input scalar; and
   the wordline driver to modulate the pulses of fixed duration across all of the multiple rows to enable the voltage output to represent the dot product of the input vector and the binary weight matrix with an increase in precision.

5. The integrated circuit of claim 2, wherein:
   the input vector represents a multibit integer input value; and
   the capacitor circuit includes a bit serial accumulation capacitor to perform an analog bit serial accumulation operation for each bit of the multibit integer input value.

6. The integrated circuit of claim 5, wherein to perform the analog bit serial accumulation operation the capacitor circuit is to accumulate and shift values of output vectors obtained from dot products of each bit of a multibit integer input vector and the binary weight matrix, wherein accumulated and shifted values represent the dot product of the input vector and the binary weight matrix.

7. The integrated circuit of claim 1, the capacitor circuit including:
a column switch capacitor coupled to a bitline to accumulate a bitline voltage after voltage drops caused by activated memory cells coupled to the bitline, an accumulated bitline voltage not exceeding an allowable voltage swing; and
wherein the accumulated bitline voltage represents a positive integer value of an output vector equal to the dot product of the input vector and the binary weight matrix.

8. The integrated circuit of claim 1, wherein:
binary weights of the binary weight matrix include multibit binary weights stored as binary integers in a row of consecutive memory cells spanning multiple columns of the memory array; and
the capacitor circuit includes a weighted column switch capacitor for each column of memory cells, the weighted column switch capacitor capable of charge sharing with neighboring capacitors spanning the multiple columns of the memory array, the capacitor circuit to:
disconnect a binary weighted fraction of each weighted column switch capacitor during charge sharing with neighboring capacitors, wherein the binary weighted fraction of each weighted column switch capacitor represents a ratio of weighted column switch capacitors across neighboring capacitors, the ratio based on a power of two.

9. The integrated circuit of claim 1, wherein:
bitlines of the memory access circuit include differential bitlines to double an allowable voltage swing caused by activated memory cells;
binary weights of the binary weight matrix include signed binary weights, wherein the activated bitcell in which a signed binary weight is stored is enabled to cause voltage drops to the differential bitlines; and
the capacitor circuit coupled to the differential bitlines includes a differential column switch capacitor for each column of the memory array, the differential column switch capacitor to:
accumulate differential bitline voltages after voltage drops, an accumulated differential bitline voltage not exceeding a doubled allowable voltage swing;
determine a differential voltage output between the accumulated differential bitline voltage; and
wherein the differential voltage output for each column of the memory array represents a signed integer value of an output vector equal to the dot product of the input vector and the binary weight matrix.

10. The integrated circuit of claim 9, wherein the input vector represents a ternary input value and:
a first pulse of fixed duration based on the input vector represents a ternary value of one, the first pulse to enable activated memory cells to cause voltage drops in a first one of the differential bitlines;
a second pulse of fixed duration based on the input vector represents a ternary value of negative one, the second pulse to enable activated memory cells to cause voltage drops to a second one of the differential bitlines; and
no pulse based on the input vector representing a zero ternary value to enable no memory cells to cause voltage drops to any of the differential bitlines.

11. The integrated circuit of claim 9, wherein:
binary weights of the binary weight matrix include multibit binary weights stored as signed binary integers, wherein the activated memory cells in which the signed binary integers are stored are enabled to cause voltage drops in the differential bitlines; and
the capacitor circuit includes a negation circuit coupled to a column of the memory array corresponding to a bitcell in which a most significant bit of a multibit binary weight is stored, the negation circuit to invert an accumulated differential bitline voltage caused by the activated memory cells.

12. The integrated circuit of claim 9, wherein:
binary weights of the binary weight matrix include multibit binary weights stored as signed binary integers, wherein the activated memory cells in which the signed binary integers are stored are enabled to cause voltage drops in the differential bitlines; and
the capacitor circuit includes a weighted differential column switch capacitor coupled to a column of the memory array, the weighted differential column switch capacitor capable of charge sharing with neighboring capacitors spanning multiple columns of the memory array, the capacitor circuit further to:
disconnect a binary weighted fraction of each weighted differential column switch capacitor during charge sharing of neighboring capacitors, wherein the binary weighted fraction of each weighted differential column switch capacitor represents a ratio of weighted differential column switch capacitors across neighboring capacitors, the ratio based on a power of two; and
wherein the capacitor circuit further includes a negation circuit to swap the differential voltage output for each column of the memory array.

13. The integrated circuit of claim 1, wherein the memory cells of the memory array are any of a 6T SRAM and an 8T SRAM memory cell.

14. An apparatus, comprising:
a compute-in-memory (CIM) circuit, the CIM circuit comprising a computation circuit coupled to a memory array of memory cells for storing a binary weight matrix, the computation circuit comprising:
precharged bitlines of equal capacitance coupled to columns of memory cells of the memory array;
wordlines coupled to rows of memory cells of the memory array;
column switch capacitors coupled to the precharged bitlines of equal capacitance;
wherein the computation circuit to:
generate pulses of fixed duration across the rows of memory cells based on an input vector to the computation circuit,
capture on the precharged bitlines an amount of voltage drop for memory cells that discharge to the precharged bitlines in response to the pulses of fixed duration, the amount of voltage drop for a bitcell equivalent to an amount of voltage drop for any other bitcell that discharges to the precharged bitlines, and
accumulate, in the column switch capacitors, equivalent amounts of voltage drop on the precharged bitlines of equal capacitance; and
wherein an accumulated voltage drop on all the precharged bitlines represents a binary dot product of the input vector and the binary weight matrix.

15. The apparatus of claim 14, wherein the memory cells of the memory array are any of a 6T SRAM and an 8T SRAM memory cell.

16. The apparatus of claim 14, wherein the accumulated voltage drop on a bitline represents a positive integer value of an output vector equal to the dot product of the input vector and the binary weight matrix.

17. The apparatus of claim 14, wherein:
binary weights of the binary weight matrix stored in the memory array include multibit binary weights stored in memory cells as binary integers in a row of consecutive memory cells spanning multiple columns of memory cells in the memory array; and
a column switch capacitor of a column of memory cells includes a differential column switch capacitor having a pair of column switch capacitors to form a weighted differential column switch capacitor capable of charge sharing with neighboring capacitors spanning the multiple columns of memory cells in which a multibit binary weight is stored, the computation circuit to:
disconnect a binary weighted fraction of each weighted differential column switch capacitor during charge sharing with neighboring capacitors, wherein the binary weighted fraction of each weighted differential column switch capacitor represents a ratio of weighted differential column switch capacitors across neighboring capacitors, the ratio based on a power of two.

18. The apparatus of claim 14, wherein the accumulated voltage drop on a bitline of equal capacitance is within an allowable voltage swing.

19. The apparatus of claim 18, wherein:
the bitlines of equal capacitance include bitline bars of equal capacitance doubling the allowable voltage swing for column of the memory array;
the binary weights of the binary weight matrix stored in the memory array include signed binary weights, wherein a bitcell storing a signed binary weight to discharge to a bitline and a bitline bar; and
a column switch capacitor includes a differential column switch capacitor having a pair of column switch capacitors coupled to the bitline and the bitline bar for a column of memory cells, the computation circuit to:
determine a differential voltage between a bitline voltage and a bitline bar voltage for the column of memory cells, the bitline voltage and the bitline bar voltage each based on respective accumulated equivalent voltage drops within a doubled allowable voltage swing; and
wherein the differential voltage for each column of memory cells represents a signed integer value of an output vector equal to the dot product of the input vector and the binary weight matrix.

20. The apparatus of claim 19, wherein:
the binary weights of the binary weight matrix stored in the memory array include multibit binary weights stored as signed binary integers, wherein a bitcell storing a signed binary integer discharges to a bitline and a bitline bar for a column of memory cells; and
the column switch capacitor includes a negation circuit for a column in the memory array corresponding to the bitcell storing a most significant bit of the multibit binary weight, the negation circuit to invert the differential voltage for the column corresponding to the bitcell storing the most significant bit.

21. The apparatus of claim 19, wherein the input vector represents a ternary input value, the computation circuit further comprising a pulse generator to generate:
a first pulse of fixed duration based on the input vector representing the ternary input value of one, the first pulse to enable memory cells to discharge only to the bitline and not the bitline bar;
a second pulse of fixed duration based on the input vector representing the ternary input value of negative one, the second pulse to enable memory cells to discharge only to the bitline bar and not the bitline; and
no pulse based on the input vector representing the ternary input value of zero and no discharge of any memory cells to either the bitline or bitline bar.

22. The apparatus of claim 19, wherein:
the binary weights of the binary weight matrix stored in the memory array include signed binary integers stored in a row of consecutive memory cells spanning multiple columns, wherein memory cells in which the signed binary integers are stored discharge to a bitline and a bitline bar;
the differential column switch capacitor includes a weighted differential column switch capacitor for a column of memory cells, the weighted differential column switch capacitor capable of charge sharing with neighboring capacitors spanning the multiple columns in which a multibit binary weight is stored, the computation circuit further to:
disconnect a binary weighted fraction of the differential column switch capacitor during charge sharing of neighboring differential column switch capacitors, wherein the binary weighted fractions represent a ratio of column capacitors across neighboring differential column switch capacitors, the ratio based on a power of two; and
wherein the computation circuit further includes a negation circuit to swap the differential voltage of the columns of the memory array.

23. The apparatus of claim 22, wherein:
the input vector represents a multibit integer input value; and
the computation circuit includes a bit serial accumulation capacitor to perform an analog bit serial accumulation operation for each bit of the multibit integer input value.

24. A system comprising:
a processor;
a memory device communicatively coupled with the processor, the memory device including a compute-in-memory (CIM) circuit, the CIM circuit comprising a computation circuit coupled to a memory array, the computation circuit comprising:
a memory array of memory cells to store a binary weight matrix;
a memory access circuit of bitlines having equal capacitance and wordlines driven with pulses of fixed duration based on an input vector, the pulses to activate one or more memory cells in the memory array;
the memory access circuit to enable an activated bitcell in the memory array to cause a voltage drop in a bitline to which the activated bitcell is coupled, wherein the voltage drop is equivalent to voltage drops caused by other activated memory cells in the memory array; and
a capacitor circuit coupled to the bitlines to accumulate bitline voltages after voltage drops into a voltage output, the voltage output to represent a binary dot product of the input vector and the binary weight matrix stored in the memory array.

25. The system of claim 24, the memory access circuit including a wordline driver to modulate the pulses of fixed duration based on the input vector, wherein the pulses to activate the one or more memory cells in the memory array based on binary weights of the binary weight matrix, the binary weights stored in the memory cells.

26. The system of claim 24, the capacitor circuit including:
- a column switch capacitor coupled to a bitline to accumulate a bitline voltage after voltage drops caused by activated memory cells coupled to the bitline, an accumulated bitline voltage not exceeding an allowable voltage swing; and
- wherein the accumulated bitline voltage represents a positive integer value of an output vector equal to the dot product of the input vector and the binary weight matrix.

* * * * *